US007562695B2

(12) United States Patent
Kadota et al.

(10) Patent No.: US 7,562,695 B2
(45) Date of Patent: Jul. 21, 2009

(54) COOLING DEVICE AND METHOD OF MANUFACTURING THE SAME

(75) Inventors: Shigeru Kadota, Obu (JP); Kazutoshi Nishizawa, Toyoake (JP); Tetsuya Takeuchi, Kariya (JP); Akira Ito, Kariya (JP); Satoru Nakamura, Kariya (JP)

(73) Assignee: Denso Corporation, Kariya (JP)

( * ) Notice: Subject to any disclaimer, the term of this patent is extended or adjusted under 35 U.S.C. 154(b) by 191 days.

(21) Appl. No.: 11/592,018

(22) Filed: Nov. 2, 2006

(65) Prior Publication Data
US 2007/0102138 A1 May 10, 2007

(30) Foreign Application Priority Data
Nov. 4, 2005 (JP) ............................. 2005-321337
Oct. 19, 2006 (JP) ............................. 2006-284964

(51) Int. Cl.
*F28D 1/02* (2006.01)
*F24D 19/02* (2006.01)
(52) U.S. Cl. ......................................... 165/57; 165/53
(58) Field of Classification Search ................. 165/45, 165/47, 53, 54, 57, 104.33
See application file for complete search history.

(56) References Cited
U.S. PATENT DOCUMENTS

| | | | | |
|---|---|---|---|---|
| 5,335,721 A | * | 8/1994 | Wollaber et al. ............. | 165/122 |
| 5,823,248 A | * | 10/1998 | Kadota et al. .......... | 165/104.33 |
| 6,026,891 A | | 2/2000 | Fujiyoshi et al. | |
| 6,029,891 A | | 2/2000 | Fujiyoshi et al. | |
| 6,039,111 A | | 3/2000 | Kawaguchi et al. | |
| 6,119,767 A | | 9/2000 | Kadota et al. | |
| 6,131,647 A | * | 10/2000 | Suzuki et al. .......... | 165/104.33 |
| 6,397,934 B2 | * | 6/2002 | Osakabe et al. ........ | 165/104.21 |
| 6,539,736 B1 | | 4/2003 | Isazawa et al. | |
| 6,575,230 B1 | * | 6/2003 | Kadota et al. .......... | 165/104.33 |
| 6,761,212 B2 | * | 7/2004 | DiPaolo ...................... | 165/122 |
| 2001/0042614 A1 | * | 11/2001 | Okamoto ............... | 165/104.21 |
| 2005/0006115 A1 | | 1/2005 | Ding et al. | |

OTHER PUBLICATIONS

Office Action in corresponding Chinese Patent Application No. 200610159896.3 dated May 30, 2008 with English Translation.

* cited by examiner

Primary Examiner—Teresa J Walberg
(74) Attorney, Agent, or Firm—Harness, Dickey & Pierce, PLC

(57) ABSTRACT

A cooling device has a case defining a first space through which a first fluid flows and a second space through which a second fluid having the temperature lower than that of the first fluid flows. A first heat exchanger is disposed in the first space for performing heat exchange between the first fluid and a refrigerant, thereby to evaporate the refrigerant. A second heat exchanger is disposed in the second space for performing heat exchange between the second fluid and the refrigerant evaporated in the first heat exchanger, thereby to transfer heat of the refrigerant to the second fluid. The case defines a first dimension in a first direction and a second dimension in a second direction perpendicular to the first direction in a transverse cross-section. The second dimension is larger than the first dimension. The first space and the second space are arranged in the second direction.

26 Claims, 10 Drawing Sheets

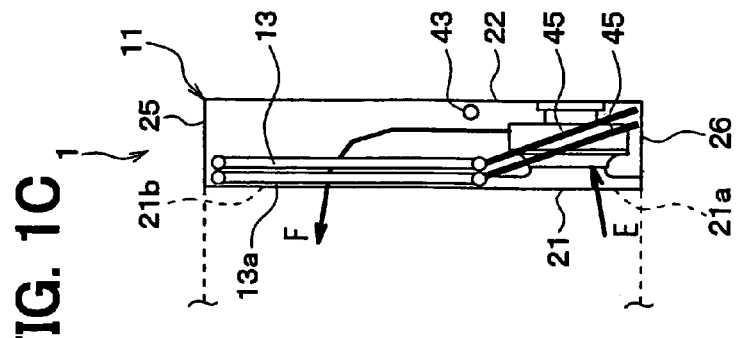
FIG. 1D
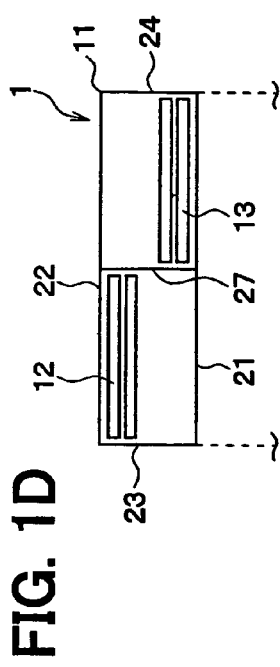
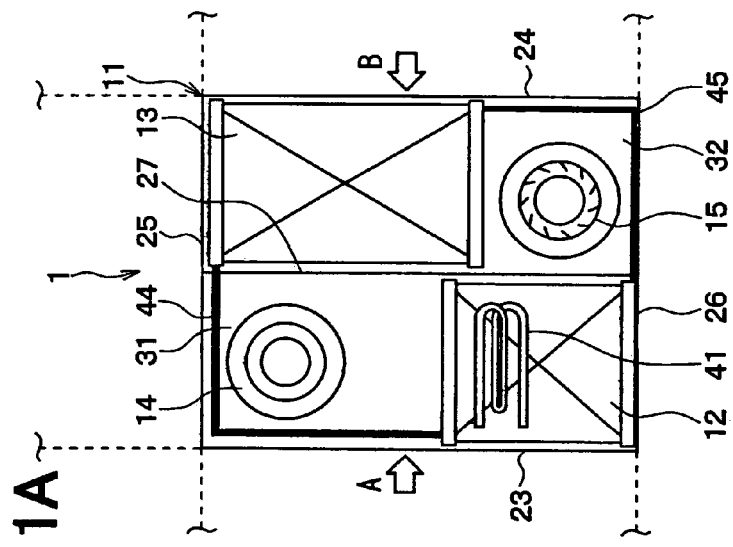
FIG. 1A
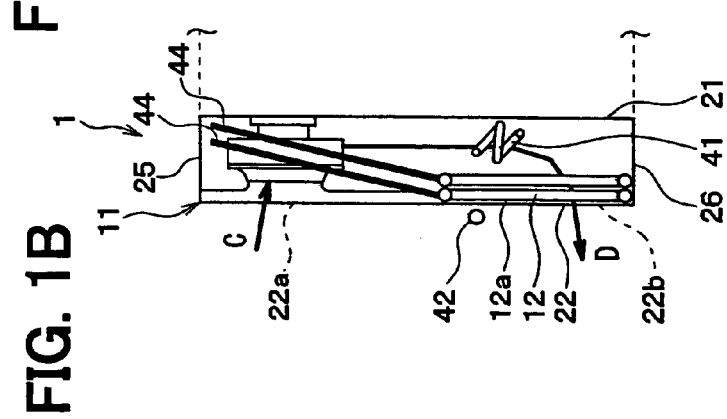
FIG. 1B

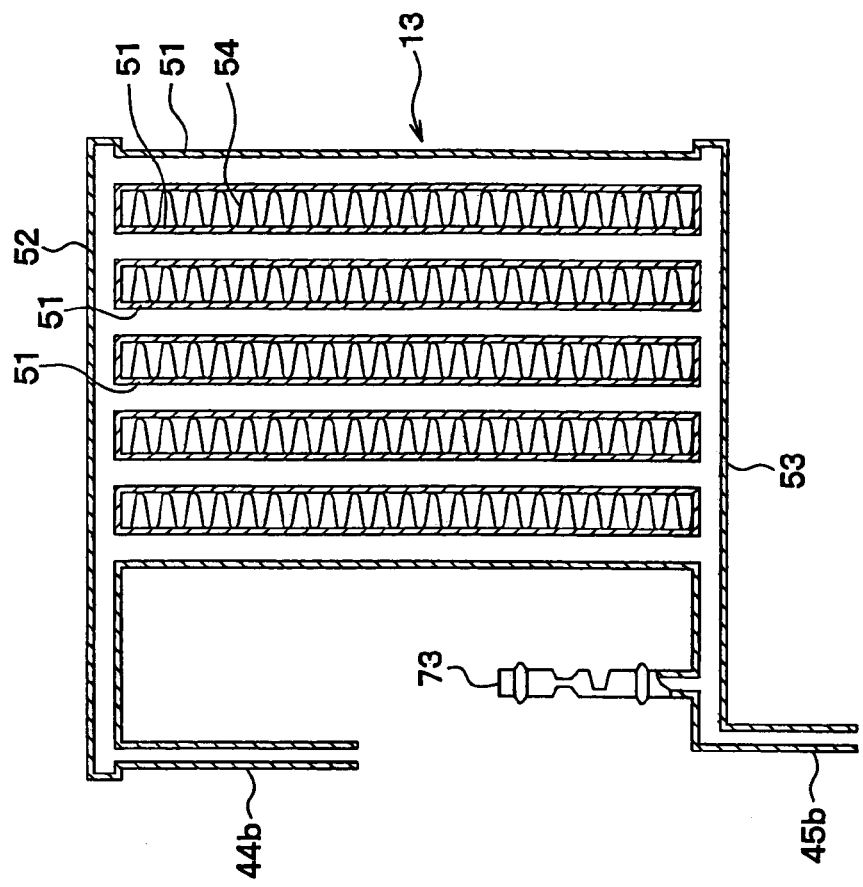
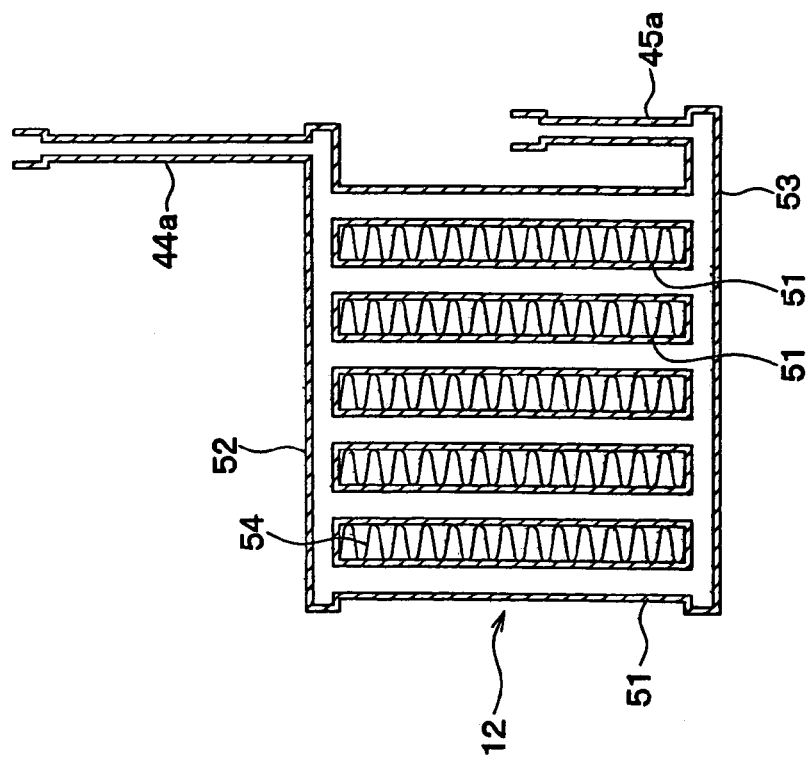

COOLING DEVICE AND METHOD OF MANUFACTURING THE SAME

CROSS REFERENCE TO RELATED APPLICATION

This application is based on Japanese Patent Application No. 2005-321337 filed on Nov. 4, 2005 and No. 2006-284964 filed on Oct. 19, 2006, the disclosures of which are incorporated herein by reference.

FIELD OF THE INVENTION

The present invention relates to a cooling device for cooling a high temperature fluid by performing heat exchange between the high temperature fluid and a low temperature fluid having a temperature lower than that of the high temperature fluid without mixing the high temperature fluid with the low temperature fluid, and a method of manufacturing the same.

BACKGROUND OF THE INVENTION

A cooling device for cooling air in a housing containing a heating element is for example disclosed in Japanese Patent Publication No. 10-190270 (U.S. Pat. No. 6,026,891) and No. 10-2686 (U.S. Pat. No. 6,119,767, U.S. Pat. No. 6,575,230). In the cooling device, a case is generally divided into an upper space and a lower space. A first heat exchanger for a low temperature fluid is provided in the upper space, and a second heat exchanger for a high temperature fluid is provided in the lower space.

A high temperature fluid is introduced in the lower space. In the lower space, heat exchange is performed between the high temperature fluid and a refrigerant flowing by the second heat exchanger. The refrigerant is boiled and evaporated by heat of the high temperature fluid, thereby cooling the high temperature fluid. On the other hand, a low temperature fluid having the temperature lower than that of the high temperature fluid is introduced in the upper space. In the upper space, heat exchange is performed in the first heat exchanger between the low temperature fluid and the refrigerant evaporated by the second heat exchanger. Thus, the refrigerant is condensed by transferring the heat to the low temperature refrigerant.

The case has a rectangular parallelepiped shape, for example. The case is mounted to the housing such that a main wall faces the housing.

In the above cooling device, to restrict heat from staying an upper location in the housing, a high temperature fluid inlet port is formed at an upper location of the case for introducing the high temperature fluid into the case. Also, the upper space for the low temperature fluid is partly used for defining a passage to introduce the high temperature fluid to the lower space of the case. Namely, the upper space of the case is divided into the high temperature fluid passage and a low temperature fluid passage in a thickness direction that is perpendicular to the main wall. Therefore, it is difficult to reduce the thickness of the case to maintain the high temperature fluid passage on a back side of the low temperature fluid passage in the upper space of the case.

SUMMARY OF THE INVENTION

The present invention is made in view of the foregoing matter, and it is an object of the present invention to provide a cooling device and a method of manufacturing the same, which is capable of reducing a thickness of the case and reducing pressure loss of a high temperature fluid in a high temperature fluid passage, as compared to the conventional case.

According to an aspect, a cooling device has a case, a first heat exchanger and a second heat exchanger. The case defines a first dimension in a first direction and a second dimension in a second direction perpendicular to the first direction in a transverse cross-section thereof. The first dimension is smaller than the second dimension. Also, the case defines a first space through which a first fluid flows and a second space through which a second fluid having a temperature lower than that of the first fluid flows. The first space and the second space are arranged in the second direction.

The first heat exchanger is disposed in the first space. The first heat exchanger performs heat exchange between the first fluid and a refrigerant flowing in the first heat exchanger, thereby to cool the first fluid by evaporating the refrigerant. The second heat exchanger is disposed in the second space. The second heat exchanger performs heat exchange between the second fluid and the refrigerant that has been evaporated in the first heat exchanger, thereby to transfer heat of the refrigerant to the second fluid by condensing the refrigerant.

The first dimension corresponds to a thickness of the case and the second dimension corresponds to a width of the case. Since the first space and the second space are arranged in the second direction, the thickness of the case can be reduced without reducing a passage area of each space, as compared with a conventional case having the same thickness and in which a first space and a second space are arranged in the first direction. The above cooling device has a thinner and slim case, and is for example mounted to a door of a housing accommodating a heating element for cooing air inside of the housing.

For example, the first space is separated from the second space in the second direction by a partition wall having a generally plate shape. Thus, the case has a simple structure.

The method of manufacturing the cooling device includes brazing a first heat exchanger having a first gas pipe section and a first liquid pipe section and a second heat exchanger having a second gas pipe section and a second liquid pipe section, respectively, in a furnace. Then, the first gas pipe section of the first heat exchanger is joined to the second gas pipe section of the second heat exchanger by torch brazing. Likewise, the first liquid pipe section of the first heat exchanger is joined to the second liquid pipe section of the second heat exchanger by torch brazing. Then, the joined first heat exchanger and the second heat exchanger is placed in a case such that the first heat exchanger is located in a first space and the second heat exchanger is located in a second space of the case Namely, a gas pipe connecting the first heat exchanger and the second heat exchanger is constructed of at least two pipe sections. A liquid pipe connecting the first heat exchanger and the second heat exchanger is constructed of at least two pipe sections. After the pipe sections are brazed to each of the first and second heat exchangers in the furnace, the separate pipe sections are joined by torch brazing. Accordingly, the connection of the gas pipe and the liquid pipe to the first heat exchanger and the second heat exchanger are performed by furnace brazing, which has reliability higher than that of the torch brazing. Also, the first heat exchanger and the second heat exchanger are brazed separately and then joined to each other by torch brazing. Therefore, it is not necessary to perform brazing in a specific large furnace.

BRIEF DESCRIPTION OF THE DRAWINGS

Other objects, features and advantages of the present invention will become more apparent from the following FIG. 1A is a front perspective view of a cooling device according to a first embodiment of the present invention;

FIG. 1B is a side perspective view of the cooling device when viewed along an arrow A in FIG. 1;

FIG. 1C is a side perspective view of the cooling device when viewed along an arrow B in FIG. 1

FIG. 1D is a top perspective view of the cooling device according to the first embodiment;

FIG. 13A is a schematic cross-sectional view of the inside air heat exchanger before joined to the outside air heat exchanger according to the third embodiment;

FIG. 13B is a schematic cross-sectional view of the outside air heat exchanger before joined to the inside air heat exchanger according to the third embodiment;

DETAILED DESCRIPTION OF EXAMPLE EMBODIMENT

A first embodiment of the present invention will be described with reference to FIGS. 1 through 10B. In the first embodiment, a cooling device is for example used for cooling air inside of a casing of a communication network base station for cellular phones accommodating communications equipment.

FIG. 1A shows an inside structure of the cooling device 1 when viewed from a front side. FIG. 1B is a perspective side view of the cooling device when viewed along an arrow A in FIG. 1A, and FIG. 1C is a perspective side view of the cooling device when viewed along an arrow B in FIG. 1A. FIG. 1D is a schematic perspective top view of the cooling device 1 for showing arrangements of inside air heat exchangers 12 and outside air heat exchangers 13. The cooling device 1 is generally arranged in an up and down direction as shown in FIGS. 1A and 2 when in use.

Figure 2:
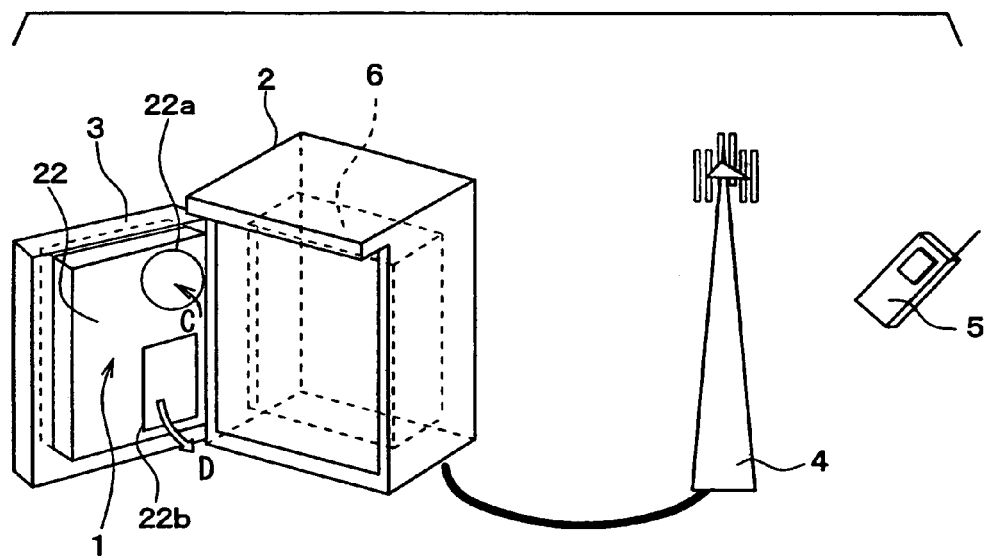
FIG. 2 is a schematic perspective view of a housing to which the cooling device is mounted according to the first embodiment.

As shown in FIG. 2, the cooling device 1 is mounted to a door 3 of a housing (casing) 2 of the base station. When the door 3 is at a closed position, the inside of the housing 2 is separated from the outside of the housing 2. The housing 2 accommodates communications equipment 6 for having communications with mobile phones 5, a nearest transit exchange and the like through an antenna 4.

In the housing 2, the communication equipment 6 generates heat as it is operated. As such, the temperature of air (inside air) inside of the housing 2 increases. Here, the inside air corresponds to a high temperature fluid, and an outside air outside of the housing 2 corresponds to a low temperature fluid having the temperature lower than that of the high temperature fluid.

The cooling device 6 is a boiling-type. As shown in FIGS. 1A through 1C, the cooling device 6 is mainly constructed of a case 11, inside air heat exchangers 12, outside air heat exchangers 13, an inside air fan 14 and an outside air fan 15.

The case 11 has a substantially rectangular parallelepiped shape. As shown in FIG. 1A, the case 11 has a front wall 21, a back wall 22, a left wall 23, a right wall 24, a top wall 25, and a bottom wall 26. The front wall 21 and the back wall 22 are opposed to each other. The left wall 23 is located on the left side of the front wall 21 and the right wall 24 is located on the right side of the front wall 21. The top wall 25 defines a top surface of the case 11 and the bottom wall 26 defines a bottom surface of the case 11.

In the case 11, the depth (thickness) is smaller than the height and the width. Namely, a dimension of the case 11 in a direction perpendicular to the front wall 21 and the back wall 22, i.e., in a direction in which the distance between the front wall 21 and the back wall 22 is measured, is smaller than other dimensions of the case 11.

Hereafter, the direction perpendicular to the front wall 21 and the back wall 22 is referred to as a thickness direction (first direction). Also, a direction in which a distance between the left wall 23 and the right wall 24 is measured is referred to as a right and left direction (second direction). The thickness direction is perpendicular to the right and left direction. As shown in FIG. 1D, in a transverse cross-section of the case 11 defined parallel to the top wall 25 and the bottom wall 26, the dimension in the thickness direction (up and down direction in FIG. 1D) is smaller than the dimension in the right and left direction.

As shown in FIG. 2, the case 1 is mounted to the door 3 of the housing 2 such that the back wall 22 faces the inside of the housing 2 and the front wall 21 faces the outside of the housing 2. Namely, the case 1 is mounted such that the thickness direction of the case 11 is perpendicular to the door 3.

Further, as shown in FIG. 1A, the inside of the case 11 is divided into two spaces in the right and left direction by a partition wall 27. The partition wall 27 has a substantially rectangular plate shape. The partition wall 27 is arranged vertically. Specifically, the partition wall 27 extends perpendicular to the front wall 21, the back wall 22, the top wall 25 and the bottom wall 26.

Figure 3:
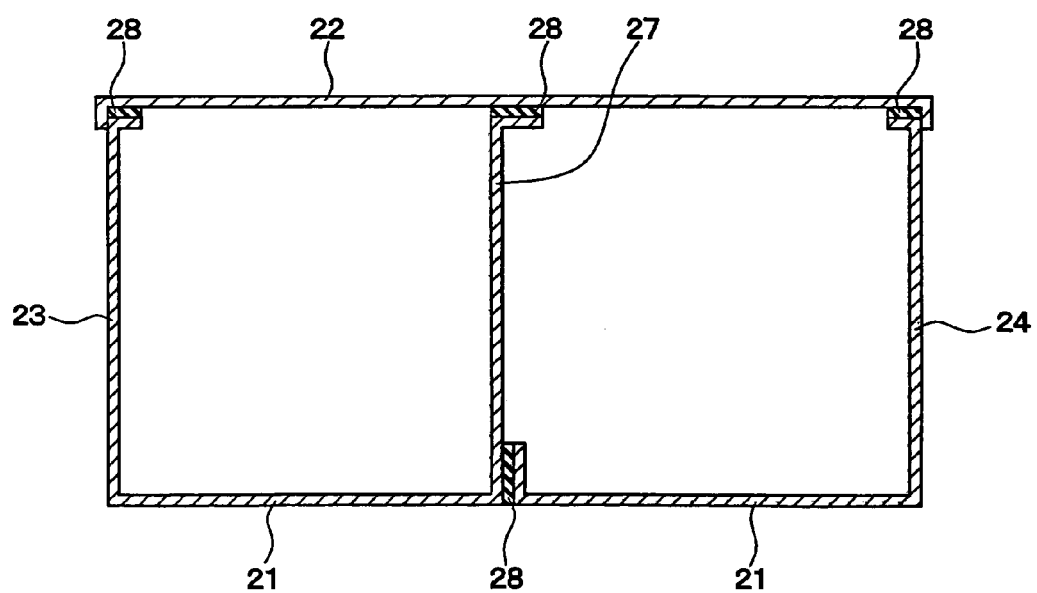
FIG. 3 is a transverse cross-sectional view of a case of the cooling device according to the first embodiment.

As shown in FIG. 3, the case 11 is constructed of a U-shaped plate member, a L-shaped plate member, and a flat plate member. The U-shaped plate member defines the left wall 23, a left half section of the front wall 21 and the partition wall 27. The L-shaped plate member defines a right half section of the front wall 21 and the right wall 24. The flat plate member defines the back wall 22. The U-shaped plate member, the L-shaped plate member and the flat plate member are fixed to each other by fixing members such as pins.

The U-shaped plate member, the L-shaped plate member and the flat plate member are made of a metal such as iron. Further, ends of each plate member are bent such that the respective plate members are joined each other through surfaces.

Also, packing 28 is interposed between joining surfaces of the respective plate members so as to restrict air communication and entry of foreign materials such as water and dust between the left space and the right space of the case 11. Moreover, sealing members can be provided in clearances between the respective plate members so as to improve resistance to water.

In FIG. 1A, the left space of the case 11 defines an inside air space (inside air passage, high temperature fluid passage) 31 through which the air inside of the housing 2 flows. Also, the right space of the case 11 defines an outside air space (outside air passage, low temperature fluid passage) 32 through which the air outside of the housing 2 flows. Alternatively, the outside air space 32 can be defined by the left space and the inside air space 31 can be defined by the right space.

As shown in FIG. 1A, in the inside air space 31, the inside air heat exchangers 12 are arranged at a lower location and the inside air fan 14 is arranged at an upper location. In the outside air space 32, the outside air heat exchangers 13 are arranged at an upper location and the outside air fan 15 is arranged at a lower location.

Namely, when the cooling device 1 is viewed through the front wall 21 along the thickness direction, the inside air heat exchangers 12 and the outside air heat exchangers 13 are arranged at a left lower location and a right upper location in the case 11, respectively. In other words, the inside air heat exchangers 12 and the outside air heat exchangers 13 are arranged on a diagonal line. Likewise, the inside air fan 14 and the outside air fan 15 are arranged at a left upper location and a right lower location in the case 11, respectively. In other words, the inside air fan 14 and the outside air fan 15 are arranged on a diagonal line.

As shown in FIG. 1B, two inside air heat exchangers 12 are arranged in layers in the thickness direction. Each of the inside air heat exchangers 12 has a rectangular parallelepiped outline. The inside air heat exchanger 12 defines a ventilation surface 12a through which the inside air flows. A thickness of the inside air heat exchanger 12, i.e., a dimension in a direction perpendicular to the ventilation surface 12a is smaller than height and width dimensions thereof. Also, the thickness of the inside air heat exchanger 12 is smaller than the thickness of the case 11. Namely, the inside air heat exchanger 12 has a generally plate-like shape.

Further, the two inside air heat exchangers 12 are arranged such that the ventilation surfaces 12a are substantially parallel to each other and the back wall 22 of the case 11. Also, the inside air heat exchangers 12 are arranged between the back wall 22 and a middle portion of the case 11 with respect to the thickness direction.

Namely, the inside air heat exchangers 12 are arranged closer to the back wall 22 than the front wall 21. A distance between the back wall 22 and the inside air heat exchangers 12 is smaller than the thickness of the inside air heat exchanger 12. Further, the inside air heat exchangers 12 are arranged close to each other such that a distance between them is smaller than the thickness of each inside air heat exchanger 12.

As shown in FIGS. 1B and 2, the back wall 22 of the case 11 is formed with openings 22a, 22b at positions corresponding to the inside air fan 14 and the inside air heat exchanger 12, respectively, as an inside air inlet port and an inside air discharge port. The inside air inlet port 22a is located higher than the inside air discharge port 22b. For example, the inside air inlet port 22a is open at a position corresponding to a suction port of the inside air fan 14.

As shown by an arrow C in FIGS. 1B and 2, the inside air is introduced in the inside air space 31 from the inside air inlet port 22a, which is located at an upper location of the case 11. The inside air flows in the inside air space 31 downwardly and is discharged from the inside air space 31 through the inside air discharge port 22b, which is located at a lower position of the case 11, as shown by an arrow D in FIGS. 1B and 2. Thus, the inside air flows in a U-turn manner in the inside air space 31.

As shown in FIG. 1C, two outside air heat exchangers 13 are arranged in the outside air space 32. Similar to the inside air heat exchangers 12, the two outside air heat exchanger 13 are arranged in two layers in the thickness direction. Each of the outside air heat exchangers 13 has a rectangular parallelepiped shape.

The outside air heat exchanger 13 defines a ventilation surface 13a. A thickness of the outside air heat exchanger 13 in a direction perpendicular to the ventilation surface 13a is smaller than other dimensions, i.e., a height and a width. Namely, the outside air heat exchanger 13 has a generally plate-like shape. The thickness of the outside air heat exchanger 13 is smaller than the thickness of the case 11.

The two outside air heat exchangers 13 are arranged such that the ventilation surfaces 13a are substantially parallel to each other and the front wall 21 of the case 11. As shown in FIG. 1D, the outside heat exchangers 13 are arranged between the front wall 21 and the middle portion of the case 11 with respect to the thickness direction. Namely, the outside air heat exchangers 13 are arranged closer to the front wall 21 than the back wall 22.

Also, a distance between the front wall 21 and the outside air heat exchanger 13 is smaller than the thickness of the outside air heat exchanger 13. Further, the two outside air heat exchangers 13 are arranged close to each other such that a distance between them is smaller than the thickness of the outside air heat exchanger 13.

When the cooling device 1 is viewed from the top, the inside air heat exchangers 12 and the outside air heat exchangers 13 are arranged at a left back location and the right back location of the case 11, respectively, as shown in FIG. 1D. Namely, the inside air heat exchangers 12 and the outside air heat exchangers 13 are arranged on a diagonal line.

As shown in FIG. 1C, the front wall 21 is formed with openings 21a, 21b as an outside air inlet port and an outside air discharge port at positions corresponding to the outside air fan 15 and the outside air heat exchangers 13, respectively. The outside air inlet port 21a is located lower than the outside air discharge port 21b. For example, the outside air inlet port 21a is open at a position corresponding to a suction port of the outside air fan 15.

The outside air is introduced into the outside air space 32 from the outside air inlet port 21a, which is located at a lower position of the case 11, as shown by an arrow E of FIG. 1C. The outside air flows upwardly in the outside air space 32 and is discharged from the outside air space 32 through the outside air discharge port 21b, which is located at an upper position of the case 11, as shown by an arrow F in FIG. 1C. As such, the outside air flows in the outside air space 32 in a U-turn manner and in a direction opposite to a flow direction of the inside air in inside air space 31. Accordingly, heat exchange is performed between the inside air and the outside air passing through refrigerant circuits including the inside air heat exchangers 12 and the outside air heat exchangers 13.

As described above, the inside air fan 14 is arranged at an upstream position in the inside air passage, and the inside air heat exchangers 12 are arranged at a downstream position in the inside air passage. Also, the outside air fan 15 is arranged at an upstream position in the outside air passage, and the outside air heat exchangers 13 are arranged at a downstream position in the outside air passage.

As the inside air fan 14 and the outside air fan 15, centrifugal fans of a forced or pressing type are used. Since the pressing type fans are used, the inside air heat exchangers 12 and the outside air heat exchangers 13 can be arranged at the downstream positions with respect to the inside air flow and the outside air flow in the inside air space 31 and the outside air space 32, respectively.

Further, a flow direction of the air can be changed generally 90 degrees by the centrifugal fan. Namely, a direction of air discharged from the centrifugal fan is changed substantially perpendicular to a direction of air sucked in the centrifugal fan. Since the centrifugal fan is used as the inside air fan 14 and the outside air fan 15, pressure loss of the inside air and the outside air due to a change of direction can be reduced even in the U-turn flow. Accordingly, noises caused by the inside air fan 14 and the outside air fan 15 can be reduced, as compared with a case using another type of fan. Further, power consumption can be reduced.

As shown in FIG. 1B, a heater 41 is provided in the inside air space 31. The heater 41 is arranged upstream of the inside air heat exchangers 12 with respect to the flow of the inside air and at a position corresponding to an upper half section of the inside air heat exchangers 12. The heater 41 is provided to maintain the temperature of the inside air inside of the housing 2 equal to or higher than a minimum temperature, e.g., zero degrees Celsius.

Also, an inside air temperature sensor 42 is provided downstream of the inside air heat exchangers 12 with respect to the flow (arrow D) of the inside air and at a position adjacent to the inside air discharge port 22b.

Further, an outside air temperature sensor 43 is provided in the outside air space 32. The outside air temperature sensor 43 is arranged downstream of the outside air fan 15 and upstream of the outside air heat exchangers 13 with respect to the flow (arrow F) of the outside air.

The inside air temperature sensor 42 and the outside air temperature sensor 43 detect the temperatures of the inside air and the outside air, respectively. The inside air fan 14 and the outside air fan 15, and the heater 41 are controlled by a non-illustrated control device based on results detected by the inside air temperature sensor 42 and the outside air temperature sensor 43.

Further, two gas pipes 44 are provided in the inside air space 31, as shown in FIGS. 1A and 1B. Each of the gas pipes 44 connects one of the inside air heat exchangers 12 and one of the outside air heat exchangers 13.

Also, two liquid pipes 45 are provided in the outside air space 32, as shown in FIGS. 1A and 1C. Each of the gas pipe 45 connects one of the inside air heat exchangers 12 and one of the outside air heat exchangers 13. Refrigerant circulates between the inside air heat exchanger 12 and the heat outside air heat exchanger 13 through the gas pipes 44 and the liquid pipes 45.

The gas pipes 44 and the liquid pipes 45 are general pipes and for example made of a metallic material. Also, the gas pipes 44 and the liquid pipes 45 define the same passage area (cross-sectional area). Namely, the gas pipes 44 and the liquid pipes 45 have the same inside diameter.

Figure 4:
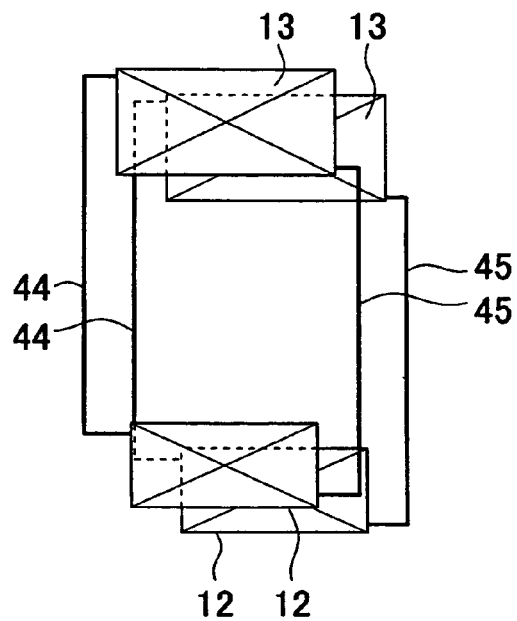
FIG. 4 is a schematic diagram of refrigerant circuits of the cooling device according to the first embodiment.

Accordingly, a closed refrigerant circuit is formed by one inside air heat exchanger 12, one outside air heat exchanger 13, the gas pipe 44 and the liquid pipe 45 in the cooling device 1. As shown in FIG. 4, the cooling device 1 has generally two separate refrigerant circuits.

In this configuration, even if one of the refrigerant circuits has an abnormality, the temperature of the inside air can be controlled by the remaining refrigerant circuit. As such, it is less likely that the cooling performance of the cooling device 1 will be zero. In the first embodiment, two refrigerant circuits are exemplary provided. The number of the refrigerant circuits is not limited to two, but can be three or more. However, the number of the refrigerant circuit can be one.

Figure 5:
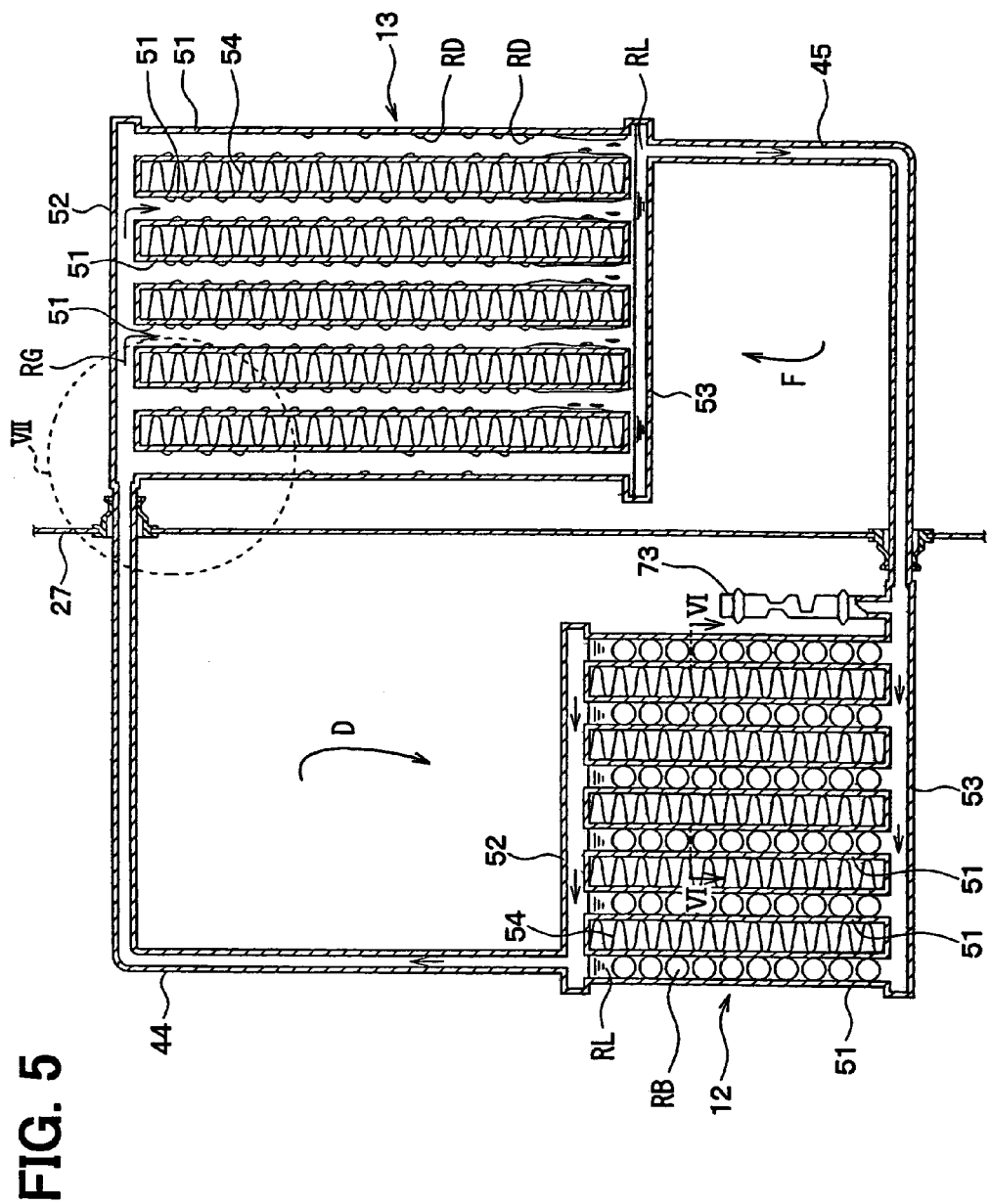
FIG. 5 is a schematic cross-sectional view of the refrigerant circuit including an inside air heat exchanger, an outside air heat exchanger, a gas pipe, a liquid pipe and a partition wall of the case according to the first embodiment.

FIG. 5 shows a schematic cross-section of the inside air heat exchanger 12, the outside air heat exchanger 13, the gas pipe 44, the liquid pipe 45, the case 11 and the partition wall 27. Each of the inside air heat exchangers 12 and the outside air heat exchangers 13 is a multi-flow path type heat exchanger having tubes 51, an upper communication part 52, a lower communication part 53 and fins 54.

Each of the tubes 51 has plural passages 55. The tubes 51 extend in the up and down direction of the case 11. Ends of the tubes 51 connect to the upper communication part 52 and the lower communication part 53, respectively. The upper communication part 52 and the lower communication part 53 extend in the right and left direction. The fins 54 are arranged between the tubes 51. The passages 55 of each tube 51 are arranged in row in a direction perpendicular to a paper plane of FIG. 5.

Figure 6:
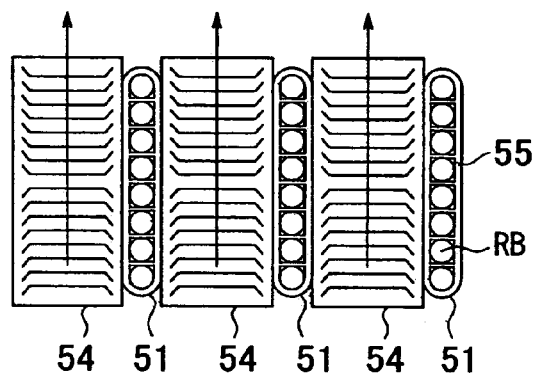
FIG. 6 is a schematic cross-sectional view of the inside air heat exchanger taken along a line VI-VI in FIG. 5.

As shown in FIG. 6, each of the passages 55 has an inner dimension substantially equal to a dimension of a bubble RB generated in liquid refrigerant. The fins 54 have a corrugated shape, for example. The tubes 51, the upper communication parts 52 and the lower communication parts 53 are made of a metallic material having high heat conductivity, such as aluminum or copper. In FIG. 6, arrows denote a flow direction of the inside air.

Also, each tube 51 of the inside air heat exchanger 12 and each tube 51 of the outside air heat exchanger 13 have the same outer dimension and the same refrigerant passage area (cross-sectional area of the passage 55). Also, the lower communication part 53 of the inside air heat exchanger 12 has the same refrigerant passage area as that of the lower communication part 53 of the outside air heat exchanger 12.

Likewise, the upper communication part 52 of the inside air heat exchanger 12 has the same refrigerant passage area as that of the upper communication part 52 of the outside air heat exchanger 13. Further, in both of the inside air heat exchanger 12 and the outside air heat exchanger 13, the passage area of the upper communication part 52 is the same as that of the lower communication part 53.

As shown in FIG. 5, the length (height) of the inside air heat exchanger 12 in the up and down direction is substantially equal to a half length (height) of the case 11. The length of the outside air heat exchanger 13 in the up and down direction is larger than the half length of the case 11. Thus, the outside air heat exchanger 13 partly overlaps the inside air heat exchanger 12 in the up and down direction of the case 11.

Each gas pipe 44 is arranged such that a first end is connected to an upper surface of the upper communication part 52 of the inside air heat exchanger 12 and a second end is connected to a side surface (left end in FIG. 5) of the upper communication part 52 of the outside air heat exchanger 13. Each liquid pipe 45 is arranged such that a first end is connected to a lower surface of the lower communication part 53 of the outside air heat exchanger 13 and a second end is connected to a side surface (right end in FIG. 5) of the lower communication part 52 of the inside air heat exchanger 12.

Figure 7:
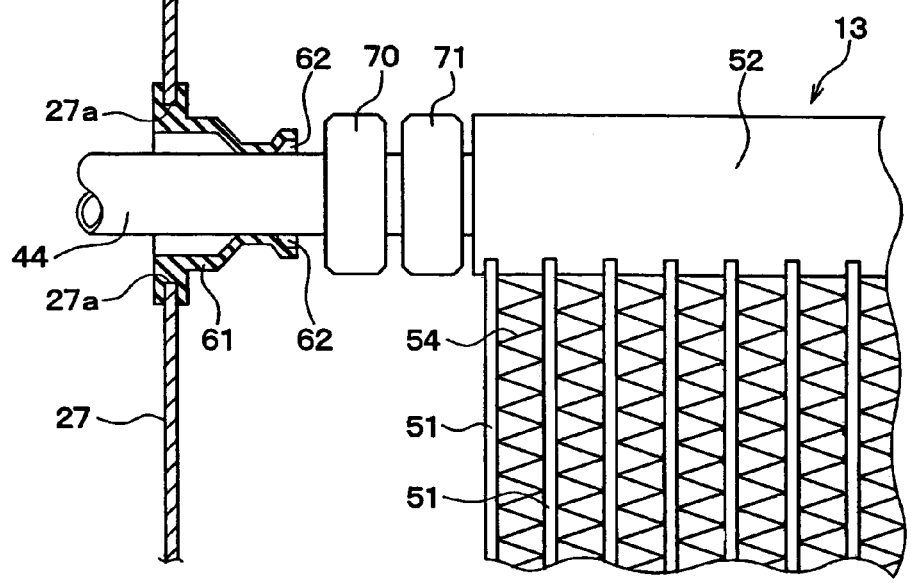
FIG. 7 is an enlarged view of a part of the cooling device circled by a dotted line VII in FIG. 5.

Next, connections between the gas pipe 44 and the upper communication part 52 and between the liquid pipe 45 and the lower communication part 53 will be described. As shown in FIG. 7, the second end of the gas pipe 44 and the upper communication part 52 of the outside air heat exchanger 13 are coupled to each other by using a nut 70 and a union 71 as fastening means.

Figure 8:
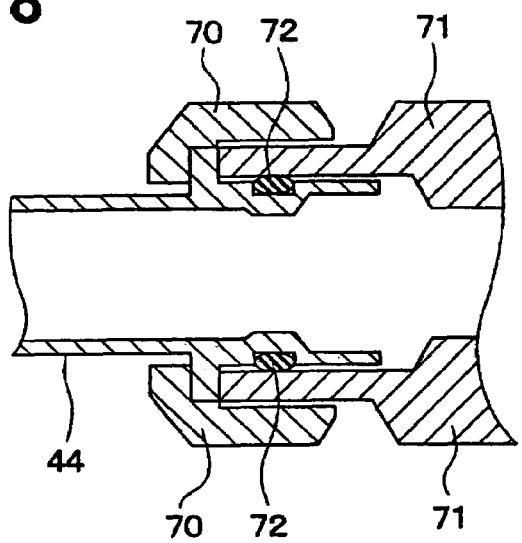
FIG. 8 is an enlarged cross-sectional view of a coupling portion between the gas pipe and an upper communication part of a heat exchanger using a nut and a union according to the first embodiment.

As shown in FIG. 8, the union 71 has a substantially tubular shape and in communication with the upper communication part 52. The second end of the gas pipe 44 is received in the union 71. An O-ring 72 is interposed between the second end of the gas pipe 44 and the union 71. Further, the second end of the gas pipe 44 and the union 71 are hermetically connected to each other by the nut 70. The second end of the liquid pipe 45 is coupled to the lower communication part 53 of the inside air heat exchanger 12 in the similar manner, as shown in FIG. 8.

Further, the gas pipe 44 extends through the partition wall 27, as shown in FIG. 7. For example, a connecting member 61 is provided on a hole 27a of the partition wall 27, as a water resistant member, i.e., a hermetic member. The gas pipe 44 extends through the connecting member 61 from the inside air space 31 toward the outside air space 32.

The connecting member 61 is for example made of rubber and seals a clearance between the separation wall 27 and the gas pipe 44. Also, a sealing agent 62 is applied between the connecting member 61 and the gas pipe 44 so as to improve the water resistance. In a case that the clearance between the separation wall 27 and the gas pipe 44 is sufficiently sealed, i.e., the water resistant is sufficient, the sealing agent 62 may not be necessary. The liquid pipe 45 extends through the partition wall 27, in a manner similar to the gas pipe 44. A clearance between the liquid pipe 45 and the partition wall 27 is tightly sealed by the connecting member 61 and the sealing agent 62, in the similar manner as shown in FIG. 7.

As described above, the second ends of the pipes 44, 45 are coupled to the heat exchangers 12, 13 through the nuts 70 and the unions 71, respectively. Therefore, the pipes 44, 45 can be coupled to the heat exchangers 12, 13, respectively, after inserting into the holes 27a of the partition wall 27.

Further, as shown in FIG. 5, the lower communication part 53 of the inside air heat exchanger 12 is formed with a refrigerant injection pipe 73. The refrigerant is injected into the refrigerant circuit from the refrigerant injection pipe 73. For example, the refrigerant injection pipe 73 is made of a metallic material such as aluminum. The refrigerant injection pipe 73 is located in the inside air space 31.

Figure 9:
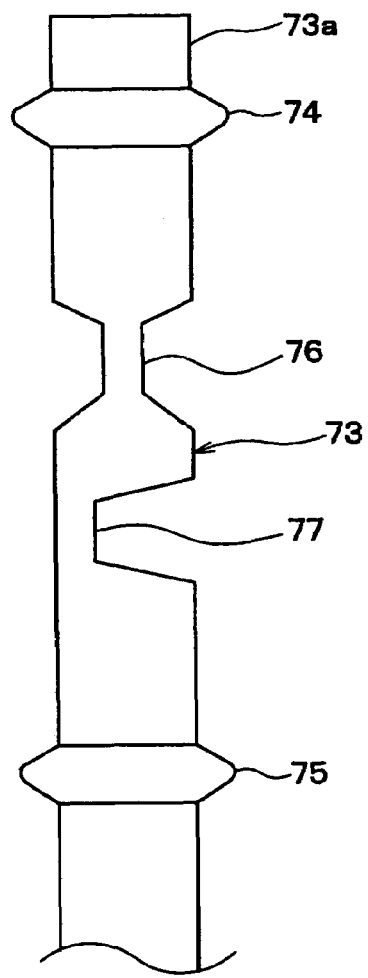
FIG. 9 is a schematic enlarged side view of a refrigerant injection pipe of the cooling device according to the first embodiment.

As shown in FIG. 9, the refrigerant injection pipe 73 is a substantially straight pipe, and an end 73 is sealed by brazing. The refrigerant injection pipe 73 has a first projection 74 and a second projection 75 on its outer wall. Each of the first projection 74 and the second projection 75 has an annular shape extending in a circumferential direction of the refrigerant injection pipe 73.

The first projection 74 and the second projection 75 are separated from each other in a longitudinal direction of the refrigerant injection pipe 73. Also, the refrigerant injection pipe 73 is formed with a first crimped portion 76 and a second crimped portion 77 between the first projection 74 and the second projection 75.

Figure 10A:
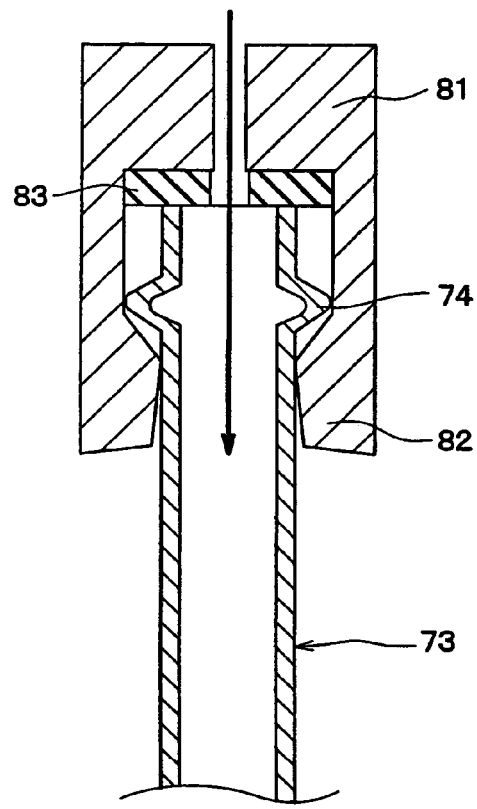
FIG. 10A is an explanatory cross-sectional view of the refrigerant injection pipe for explaining a refrigerant injection step according to the first embodiment.

Next, a method of injecting the refrigerant and sealing the refrigerant injection pipe 73 will be described with reference to FIGS. 10A and 10B. First, as shown in FIG. 10A, an injection coupler 81 of a refrigerant injection device is coupled onto the refrigerant injection pipe 73. Specifically, the coupler 81 is slipped over the end 73a of the refrigerant injection pipe 73 such that the first projection 74 is covered and an end 82 of the coupler 81 is located on an opposite side of the end 73a with respect to the first projection 74.

Then, the refrigerant is injected. At this time, because the end 73a of the refrigerant injection pipe 73 is in contact with a rubber packing 83 arranged on an inner wall of the coupler 81, the refrigerant injection pipe 73 and the coupler 81 are sealed with each other.

Here, an inner diameter of the end 82 of the coupler 81 is smaller than an outer diameter of the first projection 74 of the refrigerant injection pipe 73. Because the end 82 of the coupler 81 is engaged with the first projection 74, the coupler 81 is restricted from being separated from the refrigerant injection pipe 73 during injection of the refrigerant.

After the injection of the refrigerant, the refrigerant injection pipe 73 are crimped at two positions 76, 77. Thus, the first and second crimped portions 76, 77 are formed. Then, the coupler 81 is removed from the refrigerant injection pipe 73. Next, a brazing material is filled in a portion 78 of the refrigerant injection pipe 73 between the end 73a and the first crimped portion 73. Thus, the end 73a of the refrigerant injection pipe 73 is sealed by brazing.

If it is failed to enclose the refrigerant due to such as entry of air bubbles, it is possible to cut the refrigerant injection pipe 73 at a position between the second crimped portion 77 and the second projection 75 and repeat the above injection step and sealing step. Accordingly, the refrigerant is injected and enclosed in the refrigerant circuit.

In the above, the refrigerant injection pipe 73 is arranged in communication with the lower communication part 53 of the inside air heat exchanger 12. However, the position of the refrigerant injection pipe 73 can be changed. For example, the refrigerant injection pipe 73 can be arranged on the liquid pipe 45 inside of the inside air space 31.

Also, the number of the projections 74, 75 is not limited to two. The refrigerant injection pipe 73 can have three or more projections. Moreover, the shape of the projections 74, 75 is not limited to the annular shape as long as the separation of the coupler 81 during the injection of the refrigerant is restricted. For example, the projections 74, 75 can be formed partly in the circumferential direction.

In the refrigerant circuit, the inside air heat exchanger 12 performs heat exchange between the inside air, which has the temperature higher than the outside air, and liquid refrigerant RL in the tubes 51 through the fins 54. As such, the liquid refrigerant RL boils and bubbles RB are generated in the tubes 51, as shown in FIG. 5. Namely, the liquid refrigerant receives heat from the inside air and changes into gas refrigerant RG. Accordingly, the inside air is cooled by the inside air heat exchanger 12 in the inside air space 31.

In the outside air heat exchanger 13, heat exchange is performed between the outside air that has the temperature lower than that of the inside air and the gas refrigerant RG in the tubes 51 through the fins 54. As such, the gas refrigerant RG is condensed into drops RD and the liquid refrigerant RG is accumulated in the lower communication part 53. Accordingly, the heat of the refrigerant is transferred to the outside air.

Here, the outside air heat exchanger 13 is located higher than the inside air heat exchanger 12. Therefore, the refrigerant naturally circulates in the refrigerant circuit through the inside air heat exchanger 12, the gas pipe 44, the outside air heat exchanger 13, the liquid pipe 45 and the inside air heat exchanger 12 in this order, due to differences of densities between the gas refrigerant RG and the liquid refrigerant RL.

Accordingly, the cooling device 1 cools the air inside of the housing 2 by using a heat exchange cycle of the refrigerant in the inside air heat exchanger 12 and the outside air heat exchanger 13.

Also, the partition wall 27 is made of the metallic material and the inside air and the outside air flow in the opposite directions in the inside air space 31 and the outside air space 32. Thus, heat exchange is performed directly between the inside air and the outside air through the partition wall 27. As such, the air inside of the housing 2 can be also cooled by this direct heat exchange.

Next, advantageous effects of the first embodiment will be described.

(1) The inside air space 31 through which the inside air flows and the outside air space 32 through which the outside air flows are arranged next to each other in the case 11, in the right and left direction. The inside air heat exchangers 12 are arranged in the inside air space 31 and the outside air heat exchangers 13 are arranged in the outside air space 32.

Namely, the outside air passage and the inside air passage are arranged next to each other in the right and left direction of the case 11. In this configuration, the thickness of the case 11 can be reduced without largely reducing a passage area of each of the inside air passage and the outside air passage, as compared to a conventional cooling device having a case with the same thickness as the case 11 and in which an inside air passage and an outside air passage are arranged in a thickness direction of the case. Accordingly, the cooling device 1 of the first embodiment has a thinner and slim outline, as compared to the conventional cooling device.

In the case 11, the inside air inlet port 22a is formed at the upper location so as to restrict heat from staying at an upper area in the housing 2. Also in the conventional cooling device, the inside air inlet port is formed at an upper location of the case. However, the inside air passage is formed by using a part of the outside air passage. Namely, the inside air passage is formed on a rear side of the outside air passage and in a lower space. Therefore, a passage area of the inside air passage is small.

On the contrary, in the first embodiment, the inside air passage and the outside air passage are arranged next to each other in the right and left direction of the case 11. Therefore, a dimension of the inside air passage in the thickness direction of the case 11 can be equal to the thickness of the case 11.

Therefore, even when the case 11 has the same shape and size as the case of the conventional cooling device, a cross-sectional area, i.e., the passage area of the inside air passage of the case 11 is larger than that of the conventional cooling device. Accordingly, pressure loss of the fluid in the inside air passage of the case 11 can be reduced smaller than that of the conventional cooling device.

As a result, when a flow rate of the fluid in the inside air passage is the same, a rotation speed of the inside air fan 14 can be reduced smaller than that of the conventional cooling device. Therefore, noise due to the operation of the inside air fan 14 and power consumption can be reduced in the cooling device 1, as compared to the conventional cooling device.

(2) The case 11 is separated into the inside air space 31 and the outside air space 32 through the partition wall 27 in the right and left direction.

In the conventional cooling device, on the other hand, a separation wall is disposed to separate the case into an upper space and a lower space. Also, the separation wall has a bent shape to further separate the upper space into two in the thickness direction of the case.

Therefore, the case 11 has a structure simpler than the case of the conventional cooling device. As such, process for manufacturing the case 11 is simpler than that of the conventional case.

The case 11 has the rectangular parallelepiped shape. The case 11 is constructed by joining and fixing the U-shaped plate member, the L-shaped plate member and the flat plate member. Further, the packing 28 is interposed between the joining surfaces of the respective plate members. Moreover, the clearances between the respective plate members are sealed by the sealing agent so as to have the resistance to water.

In the first embodiment, the inside air space 31 is formed by the U-shaped plate member. The outside air space 32 can also be formed by the U-shaped plate member so as to reduce the joining portions. Therefore, processing for having the resistance to water becomes simple.

In the conventional case, the separation wall has the bent shape, not a generally flat shape. In this case, joining portions of the separation wall with metallic plate members of the case have a complicated structure.

In the first embodiment, on the other hand, the partition wall 27 has the generally flat shape. Therefore, the joining portions of the partition wall 27 with the metallic plate members of the case 11 have the structure simpler than those of the conventional case. With this, it becomes easy to arrange and apply the packing 28 and the sealing agent. Thus, the reliability of the resistance to water improves, as compared to the conventional case.

(3) The gas pipe 44 and the liquid pipe 45 are arranged inside of the case 11. Also, the gas pipe 44 and the liquid pipe 45 extend through the holes 27a of the partition wall 27. Further, the clearances between the pipes 44, 45 and the partition wall 27 are sealed with the connecting members 61 and the sealing members 62 so as to restrict entry of the foreign materials such as water sucked in the outside air space 32 into the inside air space 31 due to weather conditions such as rain and wind.

In a case that the partition wall is arranged horizontally, water in the upper space easily flows downwardly into the lower space through the clearance between the partition wall and the pipe.

On the other hand, in the cooling device 1, the partition wall 27 is substantially parallel to the vertical direction, and the pipes 44, 45 extends through the partition wall 27 in the substantially horizontal direction. Therefore, it is less likely that the water will enter the neighboring space through the clearances between the partition wall 27 and the pipes 44, 45, as compared with the case in which the partition wall is arranged horizontally. Accordingly, even if the processing of the water resistance is made similar to the conventional cooling device, reliability of the resistance to water improves in the cooling device 1.

In addition, the clearance between each pipe 44, 45 and the partition wall 27 is sealed by the connecting member 61 and the sealing agent 62 so as to reduce an area to be sealed. Therefore, reliability of the sealing structure improves.

(4) The gas pipe 44 and the liquid pipe 45 are made of the metallic material. Also, the gas pipe 44 and the liquid pipe 45 are not covered with heat insulating materials. Namely, the gas pipe 44 and the liquid pipe 45 are bare in the inside air space 31 and the outside air space 32, respectively.

In a case that the gas pipe 44 is arranged inside of the outside air space 32 or outside of the case 11, if the temperature of the outside air is below the condensing temperature of the refrigerant, the gas refrigerant in the gas pipe 44 is cooled by the outside air and is partly condensed. Also, in a case that the liquid pipe 45 is arranged outside of the inside air space 31, if the temperature of the inside air is higher than the boiling temperature of the refrigerant, the liquid refrigerant in the liquid pipe 45 is heated by the inside air and partly evaporated.

In these cases, the condensed refrigerant flows downwardly against the gas refrigerant flowing upwardly in the gas pipe 44. Likewise, in the liquid pipe 45, the evaporated refrigerant flows upwardly against the liquid refrigerant flowing downwardly. Accordingly, gas-liquid interference occurs in the gas pipe 44 and the liquid pipe 45. As a result, the flow of the refrigerant is hampered, and a cooling performance of the cooling device deteriorates.

In the first embodiment, on the other hand, the gas pipe 44 and the liquid pipe 45 are arranged inside of the inside air space 31 and the outside air space 32. Therefore, even if the gas pipe 44 and the liquid pipe 45 are uncovered, the condensation of the refrigerant in the gas pipe 44 and the evaporation of the refrigerant in the liquid pipe 45 are reduced. Accordingly, it is less likely that the flow of the refrigerant will be hampered in the gas pipe 44 and the liquid pipe 45. Thus, the refrigerant can circulate in the refrigerant circuit properly, and the cooling performance of the cooling device 1 improves.

(5) The inside air heat exchangers 12 are arranged at the lower position in the inside air space 31, and the outside air heat exchangers 13 are arranged at the upper position in the outside air space 32. Namely, the inside air heat exchangers 12 and the outside air heat exchangers 13 are arranged on the diagonal line of the substantially rectangular parallelepiped shape of the case 11. Thus, the refrigerant naturally flows because of the density difference of the gas refrigerant and the liquid refrigerant.

Further, the inside air fan 14 is arranged at the upper location in the inside air space 31, and the outside air fan 15 is arranged at the lower location in the outside air space 32. Namely, the inside air fan 14 and the outside air fan 15 are arranged on the diagonal line of the substantially rectangular parallelepiped shape of the case 11.

Moreover, the back wall 22 of the case 11 is formed with the inside air inlet port 22a and the outside air discharge port 22b at positions corresponding to the inside air fan 14 and the inside air heat exchangers 12, respectively. Also, the front wall 22 of the case 11 is formed with the outside air inlet port 21a and the outside air discharge port 21b at positions corresponding to the outside air fan 15 and the outside air heat exchangers 13, respectively.

In this configuration, the inside air sucked from the inside air inlet port 22a flows downwardly toward the inside air discharge port 22b. Thus, the inside air makes the U-turn flow in the inside air space 31. Further, the outside air sucked from the outside air inlet port 21a flows upwardly toward the outside air discharge port 22b. Thus, the outside air makes the U-turn flow in the outside air space 32.

Since the outside air flows upwardly in the outside air space 32, it is less likely that foreign materials or contaminants contained in the outside air will adhere to the outside air heat exchanger 13 because of its weight. Also, since the outside air flows in the substantially U-shape in the outside air space 32, even if the outside air sucked in the outside air space 32 contains the foreign materials or contaminants, the foreign materials or contaminants will adhere to the back wall 22 and the top wall 25 of the case 11 before reaching the outside air heat exchangers 13. As such, the adhesion of the foreign materials or contaminants to the outside air heat exchangers 13 can be reduced.

The inside air heat exchangers 12 are arranged adjacent to the back wall 22 and the outside air heat exchangers 13 are arranged adjacent to the front wall 21, as shown in FIG. 1D. Namely, the inside air heat exchangers 12 and the outside air heat exchangers 13 are arranged on the diagonal line of the rectangular shape of the top wall 24 when viewed from the top.

Each of the inside air heat exchangers 12 and the outside air heat exchangers 13 has the rectangular parallelepiped outer shape. The thickness of the inside heat exchangers 12 and the outside heat exchangers 13 is smaller than the thickness of the case 11. Also, the inside air heat exchangers 12 are arranged adjacent to the back wall 22 in the inside air space 31 such that the ventilation surface 12a is substantially parallel to the back wall 22. Likewise, the outside air heat exchangers 13 are arranged adjacent to the front wall 21 in the outside air space 32 such that the ventilation surface 13a is substantially parallel to the front wall 21.

The above arrangement can increase the passage areas of the inside air and the outside air in the case 11. Further, a flow speed and a flow rate of the fluid passing through the respective heat exchangers can be more uniformed, as compared with a case in which the inside air heat exchangers and the outside air heat exchangers are not arranged parallel, but arranged in inclined positions with respect to the back wall 22 and the front wall 21.

To increase the passage areas of the inside air and the outside air, it is effective to set the distance between the back wall 22 and the inside air heat exchanger 12 shorter than the thickness of the inside air heat exchanger 12, and to set the distance between the front wall 21 and the outside air heat exchanger 13 shorter than the thickness of the outside air heat exchanger 13.

(6) The length of the inside air heat exchangers 12 is substantially equal to a half length of the case 11 in the up and down direction. The length of the outside air heat exchangers 13 is longer than the half length of the case 11 in the up and down direction. As such, the outside air heat exchangers 13 overlap the inside air heat exchangers 12 with respect to the up and down direction of the case 11.

It may be possible to set the length of the outside air heat exchangers 13 smaller than the half length of the case 11 so that the outside air heat exchangers 13 does not overlap the inside air heat exchangers 12 in the up and down direction.

However, in the case 11, the inside air space 31 and the outside air space 32 are arranged next to each other in the right and left direction. There is a space defined under the outside heat exchangers 13. By using the space under the outside heat exchangers 13 effectively, the outside heat exchangers 13 can be elongated in the downward direction to overlap the inside air heat exchangers 12 without interfering with the inside air heat exchangers 12. With this, the area of the ventilation surface of the outside air heat exchangers 13, which is easily affected by the foreign materials such as dirt and contaminants, can be increased. Accordingly, heat exchange capacity of the outside air heat exchangers 13 improves.

In the first embodiment, the length of the outside air heat exchanger 13 is exemplary larger than the half length of the case 11. Similar to the outside air heat exchangers 13, the length of the inside air heat exchangers 12 can be set larger than the half length of the case 11.

Here, the amount of overlap between the inside air heat exchangers 12 and the outside air heat exchangers 13 can be optionally changed within a range so that the refrigerant properly naturally circulates in the refrigerant circuits. Namely, the length of the inside air heat exchangers 12 and the length of the outside air heat exchangers 13 can be changed appropriately within the range so that the refrigerant properly circulates.

Also, the inside air heat exchangers 12 and the outside air heat exchangers 13 are the multi-flow path type heat exchangers each having the tubes 51, the upper communication part 52 and the lower communication part 53.

The tubes 51 are produced by cutting a continuous tube member defining plurality of passages therein into a predetermined length. On the contrary, the communication parts 52, 53 are formed into a predetermined length by using a specific die. The heat exchangers 12, 13 are produced by joining the tubes 51 and the communication parts 52, 53.

Therefore, it is easier to change the length of the tubes 51 than the communication parts 52, 53. As such, it is easy to change the length of the inside air heat exchangers 12 and the outside air heat exchangers 13 in the up and down direction of the case 11.

Also, it is preferable to increase the length of the multi-flow path type heat exchanger in the up and down direction of the case 11 because the heat exchange capacity improves. On the contrary, if the upper communication part 52 is elongated in the right and left direction of the case 11, the flow amount of the refrigerant in the upper communication part 52 reduces with a distance from the joining portion between the gas pipe 44 and the upper communication part 52. However, even if the tubes 51 are elongated in the up and down direction, such a problem does not occur.

(7) In a conventional cooling device, an end of the refrigerant injection pipe is sealed with an O-ring. In this case, the refrigerant is likely to slightly leak during an extended period of use. This results in decrease of the cooling performance.

Figure 10B:
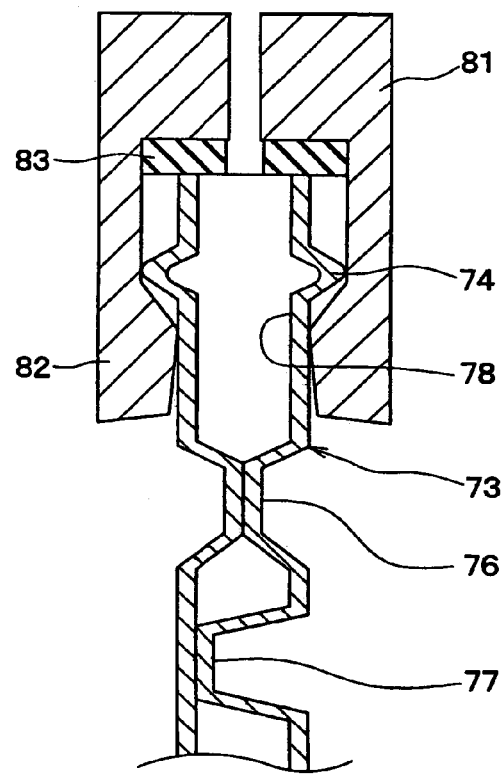
FIG. 10B is an explanatory cross-sectional view of the refrigerant injection pipe for explaining a sealing step after the refrigerant injection step according to the first embodiment.

In the first embodiment, on the other hand, the refrigerant injection pipe 73 is crimped after the injection of the refrigerant, as shown in FIGS. 10A and 10B. Further, the end 73a of the refrigerant injection pipe 73 is sealed by brazing. Therefore, leakage of the refrigerant during an extended period of use is reduced, as compared with the conventional case using the O-ring. Accordingly, the deterioration of the cooling performance is reduced.

Also, in the first embodiment, the refrigerant injection pipe 73 has the projections 74, 75 for restricting the separation of the coupler 81 during the injection of the refrigerant. The projections 74, 75 are spaced from each other in the longitudinal direction of the refrigerant injection pipe 73. Therefore, even if the enclosing or sealing of the refrigerant injection pipe 73 is failed, it can be performed again using the second projection 75.

Second Embodiment

Next, a second embodiment of the present invention will be described with reference to FIG. 11. In the second embodiment, the gas pipe 44 and the liquid pipe 45 are arranged in a different manner from the first embodiment. Structures other than the arrangement of the gas pipe 44 and the liquid pipe 45 are similar to those of the first embodiment. Here, like components are denoted by like reference characters and a description thereof is not repeated.

Figure 11:
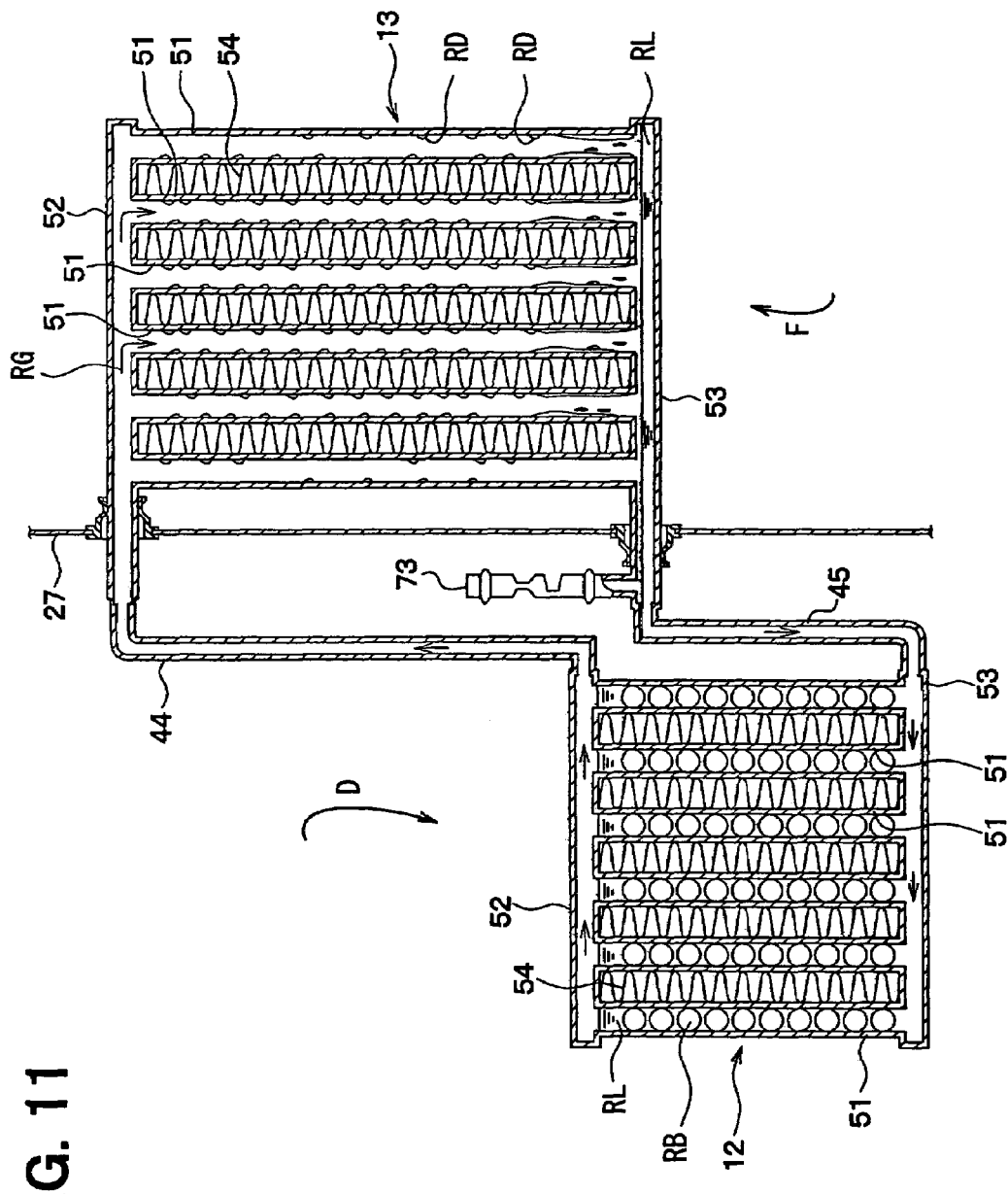
FIG. 11 is a schematic cross-sectional view of a refrigerant circuit including an inside air heat exchanger, an outside air heat exchanger, a gas pipe and a liquid pipe and a partition wall of a case of a cooling device according to a second embodiment of the present invention.

As shown in FIG. 11, the upper communication part 52 and the lower communication part 53 of the outside air heat exchanger 13 extend through the partition wall 27 of the case 11. The ends of the upper communication part 52 and the lower communication part 53 are located in the inside of the inside air space 31.

Similar to the first embodiment, the upper communication part 52 and the lower communication part 53 extend through the holes 27a of the partition wall 27 through the connecting members 61. Thus, clearances between the partition wall 27 and the upper and lower communication parts 52, 53 are sealed by the connecting members 61 and the sealing agent 62 to have the resistance to water.

As such, because the sealing area is reduced as small as possible, similar to the first embodiment, reliability of sealing improves, as compared to a case having a larger sealing area.

Also, the liquid pipe 45 is arranged inside of the inside air space 31. A first end of the liquid pipe 45 connects to the end of the lower communication part 53 of the outside air heat exchanger 13 in the inside air space 31. A second end of the liquid pipe 45 connects to the end surface of the lower communication part 53 of the inside air heat exchanger 12 in the inside air space 31.

The gas pipe 44 is arranged parallel to and adjacent to the partition wall 27 inside of the inside air space 31 so as to reduce its length. Also, a first end of the gas pipe 44 connects to the end surface of the upper communication part 52 of the inside air heat exchanger 12, adjacent to the partition wall 27 inside of the inside air space 31. A second end of the gas pipe 44 connects to the end surface of the upper communication part 52 of the outside air heat exchanger 12, adjacent to the separation wall 27 inside of the inside air space 31.

Here, the inside air heat exchangers 12, the outside air heat exchangers 13, the gas pipes 44 and the liquid pipes 45 are made of aluminum, for example. Further, in the outside air heat exchangers 13, corrosion resistance layers are formed on surfaces of the tubes 51, the upper communication parts 52 and the lower communication parts 53.

Also, the refrigerant injection pipe 73 is in communication with the lower communication part 53 of the outside air heat exchangers in the inside air space 31. The refrigerant injection pipe 73 has a structure similar to that of the first embodiment.

Next, advantageous effects of the second embodiment will be described.

In a case that the bare liquid pipe 45 is arranged in the outside air space 32 as the first embodiment, if the temperature of the outside air is as low as a temperature that the liquid refrigerant freezes, the liquid refrigerant freezes and the refrigerant will not appropriately circulate in the refrigerant circuit. In such a case, it is necessary to cover the liquid pipe 45 with the heat insulating material and the like.

In the second embodiment, on the other hand, the liquid pipe 45 is arranged inside of the inside air space 31. In the inside air space 31, the inside air having the temperature higher than that of the outside air flows. Therefore, even when the temperature of the outside air is as low as the temperature that the liquid refrigerant freezes, the liquid refrigerant in the liquid pipe 45 will not freeze. Accordingly, it is not necessary to cover the liquid pipe 45 with the heat insulating materials to restrict the liquid refrigerant from freezing.

In a case that the uncovered gas pipe 44 and the uncovered liquid pipe 45 are even partly located in the outside air space 32 of the case 11, and the gas pipe 44 and the liquid pipe 45 are made of aluminum (e.g., A3003), the gas pipe 44 and the liquid pipe 45 will have pitting corrosion due to water contained in the outside air. Further, if the outside air contains corrosive gas, the liquid pipe 45 located in the outside air space 32 is likely to be corroded. Therefore, it is necessary to process the portion of the gas pipe 44 and the liquid pipe 45 located in the outside air space 32 to have resistance to corrosion.

In the second embodiment, on the other hand, the gas pipe 44 and the liquid pipe 45 are arranged in the clean inside air space 31 that is separated from the outside air space 32 by the partition wall 27. Therefore, it is less likely that the gas pipe 44 and the liquid pipe 45 will be corroded and have pitting corrosion. Accordingly, it is not necessary to process the gas pipe 44 and the liquid pipe 45 to have the resistance to corrosion.

In addition, since the outside air heat exchangers 13 are formed with the corrosion resistance layers, the corrosion and pitting corrosion can be reduced. The corrosion resistance layers are formed on the outer surface of the outside air heat exchanger 13 in the following manner, for example. In manufacturing the outside air heat exchangers 13, zinc is thermally sprayed on the tubes 51 so as to improve the resistance to corrosion. Then, the tubes 51, the upper communication part 52 and the lower communication part 53 are brazed to each other. At the time of brazing, the zinc sprayed on the tubes 51 adheres to and mixes into a brazing material on the surface of the upper communication part 52 and the lower communication part 53. As a result, the corrosion resistance layers are formed on the upper communication part 52 and the lower communication part 53.

The arrangement position of the liquid pipe 45 either in the inside air space 31 or in the outside air space 32 is decided in view of the problems described in the above and in conditions in use.

Third Embodiment

A third embodiment of the present invention will be described with reference to FIGS. 12 to 15. Here, like components are denoted by like reference characters and a description thereof is not repeated.

Figure 12:
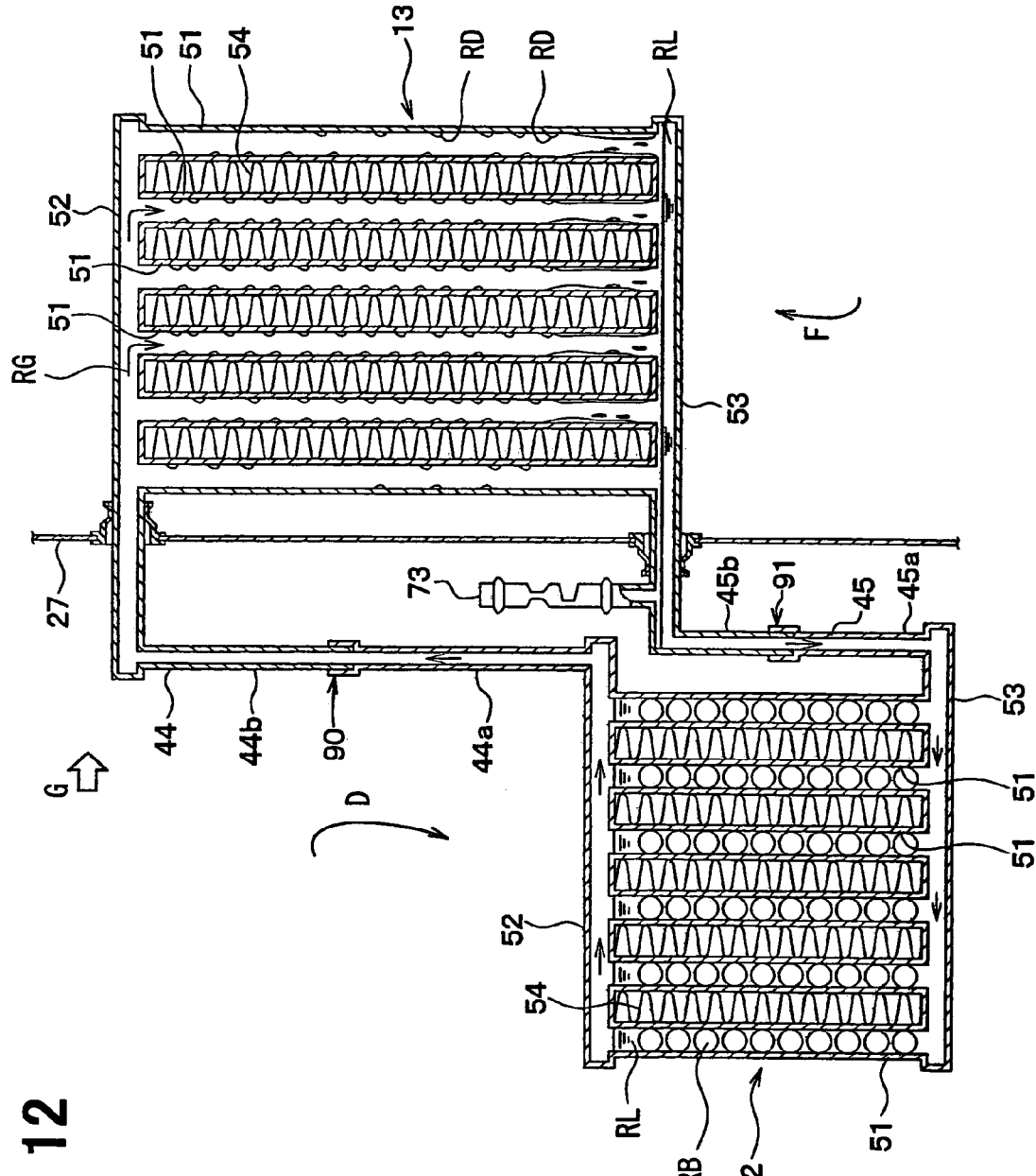
FIG. 12 is a schematic cross-sectional view of a refrigerant circuit including an inside air heat exchanger, an outside air heat exchanger, a gas pipe and a liquid pipe and a partition wall of a case of a cooling device according to a third embodiment of the present invention.

As shown in FIG. 12, the gas pipe 44 has a pipe joining portion 90 in a midstream of the flow of gas refrigerant. Namely, the gas pipe 44 is constructed of a first gas pipe section 44a connecting to the inside air heat exchanger 12 and a second gas pipe section 44b connecting to the outside air heat exchanger 13. The first gas pipe section 44a and the second gas pipe section 44b are joined to each other at the pipe joining portion 90 by brazing.

The first gas pipe section 44a and the second gas pipe section 44b have the substantially same length. The pipe joining portion 90 is located at the middle of the length of gas pipe 44. Namely, the pipe joining portion 90 is located at a position furthest from the inside air heat exchanger 12 and the outside air heat exchanger 13 in the gas pipe 44.

Also, a first end of the gas pipe 44, i.e., a lower end in FIG. 12 is connected to the top surface of the upper communication part 52 of the inside air heat exchanger 12 by brazing. A second end of the gas pipe 44, i.e., an upper end in FIG. 12 is connected to a bottom surface of the upper communication part 52 of the outside air heat exchanger 13 by brazing.

Similarly, the liquid pipe 45 is constructed of a first liquid pipe section 45a connecting to the inside air heat exchanger 12 and a second liquid pipe section 45b connecting to the outside air heat exchanger 13. The first liquid pipe section 45a and the second liquid pipe section 45b are joined to each other at a pipe joining portion 91 by brazing. The pipe joining portion 91 is located at the middle of the length of the liquid pipe 45.

Figure 14:
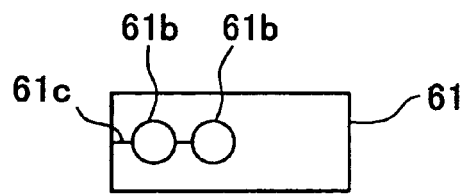
FIG. 14 is a schematic end view of a connecting member of the cooling device when viewed along an arrow G in FIG. 12.
Figure 15:
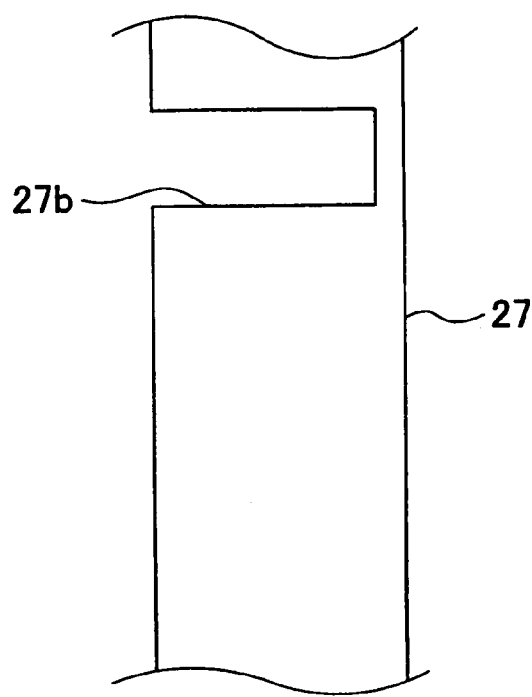
FIG. 15 is a schematic plan view of a part of the partition wall when viewed along the arrow G in FIG. 12.

Next, a method of manufacturing the cooling device of the third embodiment will be described with reference to FIGS. 13A and 13B. FIGS. 13A and 13B show cross-sectional views of the inside air heat exchanger 12 and the outside air heat exchanger 13 before assembled to each other. FIG. 14 shows an end view of the connecting member 61 when viewed along an arrow G in FIG. 12. Also, FIG. 15 shows a plan view of the partition wall 27 when viewed along the arrow G in FIG. 12.

First, the tubes 51, the upper communication part 52, the lower communication part 53, the fins 54, the first gas pipe section 44a and the first liquid pipe section 45a are integrally brazed in a furnace. Thus, the inside air heat exchanger to which the first gas pipe 44a and the first liquid pipe 45a are connected is produced, as shown in FIG. 13A.

Likewise, the tubes 51, the upper communication part 52, the lower communication part 53, the fins 45, the second gas pipe section 44b and the second liquid pipe section 45b are integrally brazed in a furnace. Thus, the outside air heat exchanger 13 to which the second gas pipe section 44b and the second liquid pipe section 45b are connected is produced, as shown in FIG. 13B. Also, the refrigerant injection pipe 73 is integrally brazed to the lower communication part 53 at the same time as brazing in the furnace.

Next, the first gas pipe section 44a and the second gas pipe section 44b are joined to each other by torch-brazing. Likewise, the first liquid pipe section 45a and the second liquid pipe section 45b are joined to each other by torch-brazing. Then, the connecting members 61 are assembled to the upper communication part 52 and the lower communication part 53 of the outside air heat exchanger 13, respectively.

In the third embodiment, the cooling device 1 has two inside air heat exchangers 12 and two outside air heat exchangers 13, similar to the first embodiment. Namely, the cooling device 1 has two refrigerant circuits. Therefore, each of the connecting members 61 is formed with two holes 61b each having a dimension corresponding to an outer dimension (outside diameter) of the upper communication part 52 or the lower communication part 53 of the outside air heat exchanger 13, as shown in FIG. 14. Further, the connecting member 61 is formed with a slit or cut 61c for inserting the upper communication part 52 and the lower communication part 53 into the holes 61b.

Then, as shown in FIG. 15, the integrated heat exchangers 12, 13 are assembled in the case 11 such that the connecting members 61 are positioned in recessions 27b of the partition wall 27. Accordingly, the cooling device 1 of the third embodiment is produced.

Next, advantageous effects of the third embodiment will be described.

(1) In the first and second embodiments, the gas pipe 44 and the liquid pipe 45 are coupled to the upper communication part 52 and the lower communication part 53 through the nuts 70 and the unions 71, respectively. Also, each coupling portion is sealed with the O-ring 72. In the sealing structure using the O-ring 72, however, the refrigerant is likely to slightly leak through the coupling portion. Therefore, when the cooling device 1 is used for a long time, the cooling performance is likely to be reduced due to leakage of the refrigerant.

In the second embodiment, on the other hand, the gas pipe 44 and the liquid pipe 45 are connected to the upper communication part 52 and the lower communication part 53 by brazing, respectively. Further, the first gas pipe section 44a and the second gas pipe section 44b are connected to each other by brazing. Likewise, the first liquid pipe section 45a and the second liquid pipe section 45b are connected to each other by brazing. Therefore, the leakage of the refrigerant at the respective joining portions will be reduced smaller than that of the first and second embodiments. Accordingly, the decrease of the cooling performance due to the leakage of the refrigerant is reduced, as compared with the first and second embodiment.

(2) In the third embodiment, the first gas pipe section 44a and the first liquid pipe section 45a are joined to the inside air heat exchanger 12 by brazing in the furnace (furnace brazing). Likewise, the second gas pipe section 44b and the second liquid pipe section 45a are joined to the outside air heat exchanger 13 by brazing in the furnace (furnace brazing). Thereafter, the first gas pipe section 44a and the second gas pipe section 44b are joined to each other by torch-brazing. Also, the first liquid pipe section 45a and the second liquid pipe section 45b are joined to each other by torch-brazing.

As a method of brazing, various kinds of thermal brazing such as the torch-brazing and furnace brazing are known. In general, the furnace brazing has a reliability of brazing higher than that of the torch-brazing. Therefore, it is preferable to perform the brazing in the furnace in a condition that the inside air heat exchanger 12, the outside air heat exchanger 13, the gas pipe 44 and the liquid pipe 45 are assembled. However, it is difficult to place such an assembled heat exchangers 12, 13 and pipes 44, 45 into a general furnace because it is large.

In the third embodiment, on the other hand, the gas pipe 44 and the liquid pipe 45 are respectively separated into the first pipe sections 44a, 45a and the second pipe sections 44b, 45b so that the inside air heat exchanger 12 and the outside air heat exchanger 13 can be placed in the furnace. Therefore, the brazing of the gas pipe 44 and the liquid pipe 45 with the inside air heat exchanger 12 and the outside air heat exchanger 13 can be performed in the furnace. Therefore, the reliability of brazing improves. Here, the furnace having a size so that each of the inside air heat exchanger 12 and the outside air heat exchanger 13 can be placed in is used.

The gas pipe 44 and the liquid pipe 45 are constructed of two pipe sections 44a, 44b, 45a, 45b, respectively. However, each of the gas pipe 44 and the liquid pipe 45 can be constructed of three or more pipe sections. In this case, however, the number of the joining portions of the pipe sections by the torch-brazing increases. Therefore, it is preferable to construct each of the gas pipe 44 and the liquid pipe 45 by the minimum number of pipe sections such as two, so as to reduce the number of the joining portions by the torch-brazing, which generally has reliability lower than that of the furnace brazing.

(3) The gas pipe joining portion 90 is formed at the middle of the gas pipe 44 along its length. Likewise, the liquid pipe joining portion 91 is formed at the middle of the liquid pipe 45 along its length. Thus, the first pipe sections 44a, 45a and the second pipe sections 44b, 45b are brazed at the position furthest from the inside air heat exchanger 12 and the outside air heat exchanger 13, respectively.

If a distance between each pipe joining portion 90, 91 and each heat exchanger 12, 13 is small, the heat exchangers 12, 13 receive heat generated by the torch-brazing. As a result, the brazing material that connects the tubes 51 and the upper and lower communication parts 52, 53 will be reheated, causing defective connections.

In the third embodiment, on the other hand, the joining portions 90, 91 are separated from the inside air heat exchanger 12 and the outside air heat exchanger 13. Therefore, such defective connections in the inside air heat exchanger 12 and the outside air heat exchanger 13 can be reduced.

Fourth Embodiment

Figure 16A:
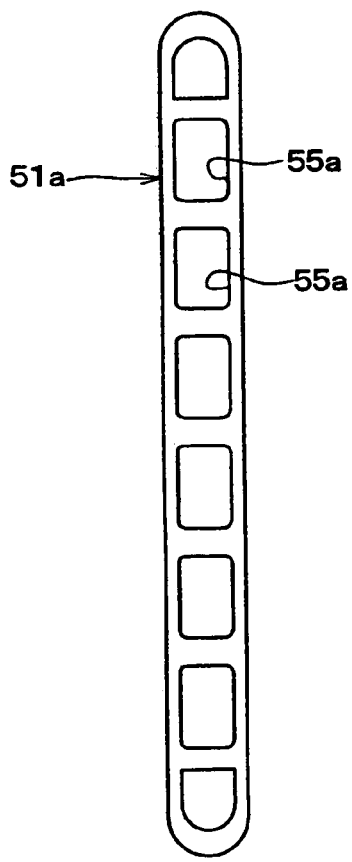
FIG. 16A is a transverse cross-sectional view of a tube of an inside air heat exchanger of a cooling device according to a fourth embodiment of the present invention.
Figure 16B:
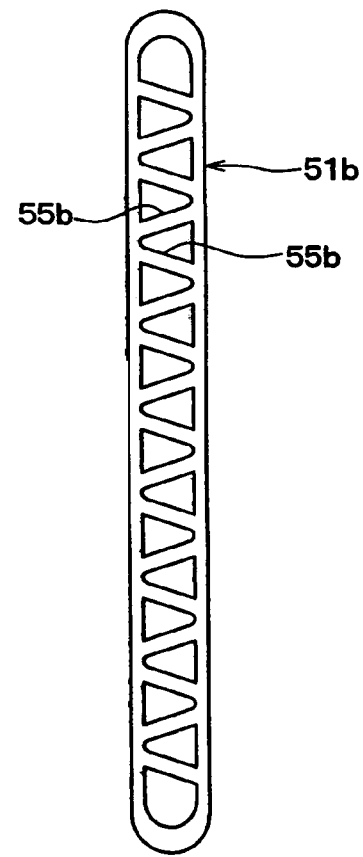
FIG. 16B is a transverse cross-sectional view of a tube of an outside air heat exchanger of the cooling device according to the fourth embodiment.

Next, a fourth embodiment of the present invention will be described with reference to FIGS. 16A and 16B. In the fourth embodiment, the inside air heat exchanger 12 has first tubes 51a having a cross-sectional shape shown in FIG. 16A, instead of the tubes 51. Also, the outside air heat exchanger 13 has second tubes 51b having a cross-sectional shape shown in FIG. 16B, instead of the tubes 51.

In the first embodiment, the passage 55 of the tube 51 of the inside air heat exchanger 12 and the passage 55 of the tube 51 of the outside air heat exchanger 13 have the same equivalent diameter. In the fourth embodiment, however, each passage 55a of the first tube 51a of the inside air heat exchanger 12 has an equivalent diameter larger than that of a passage 55b of the second tube 51b of the outside air heat exchanger 13. Here, the equivalent diameter means a diameter calculated by converting a transverse cross-sectional shape of each passage into a circle.

The first tube 51a and the second tube 51b have the same outer dimension. Specifically, the first tube 51a and the second tube 51b have the same width dimension in a direction that the passages 51a, 51b are arranged (up and down direction in FIGS. 16A and 16B). However, the number of the passages 55b of the second tube 51b is larger than that of the passages 55a of the first tube 51a.

For example, the first tube 51a for the inside air heat exchanger 12 has eight passages 55a. Each passage 55a of the first tube 51a has a substantially rectangular-shaped cross-section having an equivalent diameter of 1.5 mm. On the other hand, the second tube 51b for the outside air heat exchanger 13 has eighteen passages 55b. Each passage 55b of the second tube 51b has a substantially triangular-shaped cross-section having an equivalent diameter of 0.5 mm.

In the first embodiment, the gas pipe 44 and the liquid pipe 45 have the same inside diameter, i.e., the same passage area. In the fourth embodiment, on the other hand, the inside diameter of the liquid pipe 45 is smaller than that of the gas pipe 44, although not illustrated. For example, the inside diameter of the gas pipe 44 is 19 mm, and the inside diameter of the liquid pipe 45 is 13 mm.

In the first embodiment, the upper communication parts 52 and the lower communication parts 53 of both of the inside air heat exchanger 12 and the outside air heat exchanger 13 have the same passage area. In the fourth embodiment, on the other hand, the passage area of each lower communication part 53 is smaller than that of each upper communication part 52, although not illustrated. For example, the upper communication part 52 and the lower communication part 53 have the substantially cylindrical shape. An inside diameter of the upper communication part 52 is 32 mm. An inside diameter of the lower communication part 53 is 25 mm.

In the fourth embodiment, structures other than the above are similar to those of the first embodiment.

Next, advantageous effects of the fourth embodiment will be described.

The refrigerant flowing in the second tubes 51b of the outside air heat exchanger 13 have the density smaller than that of the refrigerant flowing in the first tubes 51a of the inside air heat exchanger 12. Therefore, even if the passages 51b of the second tube 51b are divided into smaller passages than the passages 55a of the first tube 51a, pressure loss of the flow of refrigerant in the outside air heat exchanger 13 can be maintained substantially equal to that of the inside air heat exchanger 12.

In the fourth embodiment, the passage 55a of the first tube 51a have the equivalent diameter substantially equal to or greater than the diameter of the air bubble. For example, the equivalent diameter of the passage 55a is equal to or larger than 1 mm. On the other hand, the passage 55b of the second tube 51b have the equivalent diameter smaller than that of the passage 55a of the first tube 51a.

Therefore, as compared to the structure of the first embodiment, a heat transfer area of each passage 55b of the second tube 51b increases and further heat radiation capacity of the outside air heat exchanger 13 improves in the fourth embodiment. According to a test result, the performance of the cooling device increases by 3% in the fourth embodiment.

Further, the density of the refrigerant flowing in the liquid pipe 45 is smaller than that of the refrigerant flowing in the gas pipe 44. Therefore, even when the inside diameter of the liquid pipe 45 is smaller than that of the gas pipe 44, pressure loss of the flow of refrigerant in the inside air heat exchanger 12 is maintained substantially equal to that in the outside air heat exchanger 13.

In the fourth embodiment, the inside diameter of the liquid pipe 45 is smaller than that of the gas pipe 44. Therefore, an overall size of the inside air heat exchanger 12 and the outside air heat exchanger 13 can be reduced, as compared with that of the first embodiment.

Further, the density of the refrigerant flowing in the lower communication part 53 is smaller than that of the refrigerant flowing in the upper communication part 52. Therefore, even when the passage area of the lower communication part 53 is smaller than that of the upper communication part 52, pressure loss of the flow of refrigerant in the inside air heat exchanger 12 can be maintained substantially equal to that of the refrigerant in the outside air heat exchanger 13.

In the fourth embodiment, the passage area of the lower communication part 53 is smaller than that of the upper communication part 52. Therefore, the overall size of the inside air heat exchanger 12 and the outside air heat exchanger 13 can be reduced, as compared with that of the first embodiment.

In the fourth embodiment, the dimension of the refrigerant passage area of respective portions is modified with respect to the cooling device of the first embodiment. However, the above dimensional modification can be employed to the cooling device of the second and third embodiments.

Other Embodiments (1) In the first embodiment, the gas pipe 44 is exemplary arranged in the inside air space 31. However, the gas pipe 44 can be arranged in the outside air space 32. In the first and second embodiments, the gas pipe 44 and the liquid pipe 45 are both arranged in the inside of the case 11. However, one of or both of the gas pipe 44 and the liquid pipe 45 can be arranged outside of the case 11.

(2) In the above embodiments, the inside air heat exchangers 12 and the outside air heat exchangers 13 are exemplary the multi-flow path type heat exchangers. However, the type of the heat exchanger is not limited to the multi-flow path type. Other types of the heat exchangers can be used as the heat exchangers 12, 13 of the boiling type cooling device.

(3) In the above embodiments, only one inside air fan 14 is arranged in the inside air space 31, and only one outside air fan 15 is arranged in the outside air space 32. However, the number of the inside air fan 14 and the outside air fan 15 is not limited to one, respectively. Two or more fans can be provided in each of the inside air space 31 and the outside air space 32. Also, it is not always necessarily that the number of the inside air fan 14 coincides with that of the outside air fan 15.

By providing plural fans, air blow capacity improves. Also, even if one of the fans has an abnormality, the inside air and the outside air can be blown appropriately by the remaining fans.

In the above embodiments, the centrifugal fans are exemplary used as the inside air fan 14 and the outside air fan 15. However, another type of fan can be used. For example, one of or both of the inside air fan 14 and the outside air fan 15 can be composed of an axial flow fan.

Also, in the above embodiments, the air inside of the housing 2 is circulated. In general, the axial flow fan is used for circulation of air. Thus, it is preferable to use the axial flow fan as the inside air fan 14.

(5) In the above embodiments, the inside air fan 14 and the outside air fan 15 are exemplary arranged inside of the case 11. However, it is not always necessarily to have the inside air fan 14 and the outside air fan 15 inside of the case 11 as long as the flows of the inside air and the outside air are appropriately created. For example, the fans can be arranged outside of the case 11.

(6) In the above embodiments, the case 11 with the partition wall 27 is exemplary constructed by connecting the metal plate members through the packing 28 and fixing with the pins and the like. However, the case 11 can be made by another way.

For example, the metal plate members for forming the case 11 and the partition wall 27 can be integrally joined by brazing. Further, the case 11 can have another structure as long as two separate spaces are formed in the right and left direction as in a completed product.

(7) In the above embodiments, the cooling device 1 is constructed such that the inside air and the outside air flow in opposite directions in the case 11, exemplary. However, the cooling device 1 can be constructed such that the inside air and the outside air flow in the same direction in the case 11.

(8) In the above embodiments, the cooling device 1 is constructed such that the refrigerant naturally flows in the refrigerant circuit. However, the refrigerant can be forcibly circulated in the refrigerant circuit. In this case, a pump is connected to the gas pipe 44 or the liquid pipe 45.

(9) In the above embodiments, the case 11 has the rectangular parallelepiped shape. However, the case 11 can have another shape. For example, the case can have a columnar shape. In this case, the top wall 25 and the bottom wall 26 have a substantially elliptic shape. The front wall 21, the back wall 22, the left wall 23 and the right wall 24 are formed by a columnar wall. The partition wall 27 having the rectangular shape is arranged in the columnar shaped case 11 so as to divide the space into the inside air space and the outside air space in the right and left direction. However, the shape of the partition wall 27 can be changed in accordance with the shape of the case 11.

Also, in the above embodiment, the partition wall 27 has the substantially flat plate shape. Alternatively, the partition wall 27 can have a bent shape having a bent portion as long as the space in the case 11 can be divided in the right and left direction. However, the substantially flat partition wall 27 is preferable to make the structure of the case 11 easy and improve the resistance to water.

(10) In the above embodiments, the partition wall 27 is exemplary arranged perpendicular to the front wall 21, the back wall 22, the top wall 25 and the bottom wall 26. However, it is not always necessarily that the partition wall 27 are perpendicular to the front wall 21, the back wall 22, the top wall 25 and the bottom wall 26 as long as the inside of the case 11 is separated into two spaces in the right and left direction. For example, the separation wall 27 can be arranged in an inclined position with respect to the front wall 21 and the back wall 22, or the top wall 25 and the bottom wall 26.

(11) In the above embodiments, the cooling device 1 is exemplary used as the base station cooling device for cooling the housing 2 of the cellular phone base station. However, the use of the cooling device 1 is not limited to the above. The cooling device 1 can be used as another boiling type cooling device that cools a high temperature fluid in a housing by performing heat exchange between the high temperature fluid and the low temperature fluid outside of the housing without mixing each other.

Further, an object to cool is not limited to the high temperature fluid in the housing. Namely, the cooling device 1 can be used for cooling the high temperature fluid by using the low temperature fluid having the temperature lower than that of the high temperature fluid. For example, the cooling device 1 can be used as a cooling device that cools a high temperature liquid such as cooling water and oil for cooling a heating element by using the a low temperature liquid such as water and oil having the temperature lower than that of the high temperature liquid.

The example embodiments of the present invention are described above. However, the present invention is not limited to the above embodiments, but may be implemented in other ways without departing from the spirit of the invention.

What is claimed is:

1. A cooling device comprising:
a case defining a first dimension and a second dimension that is larger than the first dimension, the first dimension measured in a first direction in a transverse horizontal cross-section of the case perpendicular to an up/down direction of the case and the second dimension measured in a second direction that is perpendicular to the first direction in the transverse horizontal cross-section of the case and perpendicular to the up/down direction of the case, the case defining a first space through which a first fluid flows and a second space through which a second fluid having a temperature lower than that of the first fluid flows, the first space and the second space arranged in the second direction;
a first heat exchanger disposed in the first space for performing heat exchange between the first fluid and a refrigerant flowing in the first heat exchanger, thereby to cool the first fluid by evaporation of the refrigerant; and
a second heat exchanger disposed in the second space for performing heat exchange between the second fluid and the refrigerant that has been evaporated in the first heat exchanger, thereby to transfer heat of the refrigerant to the second fluid by condensation of the refrigerant; wherein the case has a rectangular parallelepiped shape having a first side wall, a second side wall opposed to the first side wall, a third side wall connecting the first side wall and the second side wall, a fourth side wall opposed to the third side wall and connecting the first side wall and the second side wall, an upper wall and a lower wall, the first side wall and the second side wall extend parallel to the second direction and the third side wall and the fourth side wall extend parallel to the first direction, the case has a partition wall extending between the first side wall and the second side wall to separate the case into the first space and the second space in the second direction, the partition wall being parallel to the up/down direction of the case, the second side wall defines a first fluid inlet opening at an upper location thereof for introducing the first fluid into the first space and a first fluid discharge opening at a lower location thereof for discharging the first fluid from the first space, the first side wall defines a second fluid inlet opening at a lower location thereof for introducing the second fluid into the second space and a second fluid discharge opening at a higher location thereof for discharging the second fluid from the second space, the first heat exchanger defines a ventilation surface through which the first fluid flows and a thickness dimension in a direction perpendicular to the ventilation surface, and the thickness dimension of the first heat exchanger is smaller than the first dimension of the case, the second heat exchanger defines a ventilation surface through which the second fluid flows and a thickness dimension in a direction perpendicular to the ventilation surface, and the thickness dimension of the second heat exchanger is smaller than the first dimension of the case, the second heat exchanger is arranged at an upper location in the second space and closer to the first side wall than the second side wall, and the ventilation surface thereof is parallel to the first side wall, and the first heat exchanger is arranged at a lower location in the first space and closer to the second side wall than the first side wall, and the ventilation surface thereof is parallel to the second side wall.

2. The cooling device according to claim 1, further comprising:
a first pipe connecting the first heat exchanger and the second heat exchanger for permitting the refrigerant evaporated in the first heat exchanger to flow to the second heat exchanger, wherein
the first pipe is disposed in the first space of the case.

3. The cooling device according to claim 2, further comprising:
a second pipe connecting the second heat exchanger and the first heat exchanger for permitting the refrigerant condensed in the second heat exchanger to the first heat exchanger, wherein
the second pipe is disposed in the first space of the case.

4. The cooling device according to claim 2, wherein
the first pipe extends through the partition wall and connects to the second heat exchanger inside of the case.

5. The cooling device according to claim 4, further comprising:
a sealing member disposed between the first pipe and the partition wall for sealing therebetween.

6. The cooling device according to claim 1, further comprising:
a second pipe connecting the second heat exchanger and the first heat exchanger for permitting the refrigerant condensed in the second heat exchanger to flow to the first heat exchanger, wherein
the second pipe is disposed in the second space of the case.

7. The cooling device according to claim 6, wherein
the second pipe extends through the partition wall and connects to the first heat exchanger inside of the case.

8. The cooling device according to claim 7, further comprising:
a sealing member disposed between the second pipe and the partition wall for sealing therebetween.

9. The cooling device according to claim 1, wherein
the second heat exchanger has a plurality of tubes defining passages through which the refrigerant flows, a first communication part, a second communication part, the first communication part connected to first ends of the tubes and in communication with the passages of the tubes, the second communication part connected to second ends of the tubes and in communication with the passages of the tubes,
the first communication part and the second communication part extend through the partition wall, respectively,
the cooling device further comprising:
a first pipe defining a passage through which the refrigerant evaporated in the first heat exchanger flows, the first pipe having a first end connecting to the first heat exchanger and a second end connecting to the first communication part inside of the first space; and
a second pipe defining a passage through which the refrigerant condensed in the second heat exchanger flows, the second pipe having a first end connecting to the first heat exchanger and a second end connecting to the second communication part inside of the first space, wherein
the first pipe and the second pipe are disposed only in the first space.

10. The cooling device according to claim 9, further comprising:
a first sealing member disposed between the first communication part and the partition wall for sealing therebetween; and
a second sealing member disposed between the second communication part and the partition wall for sealing therebetween.

11. The cooling device according to claim 9, wherein
the first ends and the second ends of the first pipe and the second pipe define brazing portions that are brazed to the first heat exchanger and the second heat exchanger, respectively, by furnace brazing, and
each of the first pipe and the second pipe includes at least two pipe sections joined by torch brazing.

12. The cooling device according to claim 11, wherein
the first pipe has the at least two pipe sections joined at a joining portion, the joining portion is located at a middle portion along a length of the first pipe, and
the second pipe has the at least two pipe sections joined at a joining portion, the joining portion is located at a middle portion along a length of the second pipe.

13. A method of manufacturing a cooling device according to claim 11, the method comprising:
brazing the first heat exchanger to the first ends of the first and second pipes and the second heat exchanger to the second ends of the first and second pipes, in a furnace;
joining the at least two pipe sections of the first and second pipes, respectively, by torch brazing; and placing the first heat exchanger and the second heat exchanger joined to each other through the at least two pipe sections of the first and second pipes in a case defining a first space and a second space such that the first heat exchanger is located in the first space and the second heat exchanger is located in the second space.

14. The method according to claim 13, wherein the placing includes inserting a first communication part and a second communication part of the second heat exchanger into holes of connecting members to be mounted to the partition wall.

15. The cooling device according to claim 1, further comprising:
a first fan disposed upstream of the first heat exchanger with respect to a flow of the first fluid in the first space; and
a second fan disposed upstream of the second heat exchanger with respect to a flow of the second fluid in the second space.

16. The cooling device according to claim 15, wherein the first fan and the second fan are a pressing-in type that is mounted to the case by pressing.

17. The cooling device according to claim 15, wherein the first fan defines a suction port through which the first fluid is sucked in, and is disposed such that the suction port is in communication with the first fluid inlet opening of the case, and
the second fan defines a suction port through which the second fluid is sucked in, and is disposed such that the suction port is in communication with the second fluid inlet opening of the case.

18. The cooling device according to claim 15, wherein each of the first fan and the second fan is composed of centrifugal fans.

19. The cooling device according to claim 15, wherein the first fan is composed of an axial flow fan and the second fan is composed of a centrifugal fan.

20. The cooling device according to claim 1, wherein the first heat exchanger has first tubes each defining at least one passage, and the second heat exchanger has second tubes each defining at least one passage, and
the passage of each second tube defines an equivalent diameter smaller than that of the passage of each first tube.

21. The cooling device according to claim 1, wherein each of the first heat exchanger and the second heat exchanger has tubes defining passages through which the refrigerant flows, a first communication part and a second communication part, the first communication part connecting to first ends of the tubes and in communication with the passages, the second communication part connecting to second ends of the tubes and in communication with the passages,
the cooling device further comprising:
a first pipe defining a passage through which the refrigerant evaporated in the first heat exchanger flows, the first pipe connecting the first communication part of the first heat exchanger and the first communication part of the second heat exchanger; and
a second pipe defining a passage through which the refrigerant condensed in the second heat exchanger, flows, the second pipe connecting the second communication part of the first heat exchanger and the second communication part of the second heat exchanger, wherein
the passage of the second communication part defines a passage area smaller than that of the first communication part.

22. The cooling device according to claim 21, wherein the refrigerant injection pipe defines an axis along its length and has a plurality of projections on its outer wall for restricting a coupler for injection of the refrigerant from separating from the refrigerant injection pipe, and
the projections are spaced from each other along the axis.

23. The cooling device according to claim 1, further comprising:
a first pipe defining a passage through which the refrigerant evaporated in the first heat exchanger flows, the first pipe connecting the first heat exchanger and the second heat exchanger; and
a second pipe defining a passage through which the refrigerant condensed in the second heat exchanger flows, the second pipe connecting the second heat exchanger and the first heat exchanger, wherein
the passage of the second pipe defines a passage area smaller than that of the passage of the first pipe.

24. The cooling device according to claim 1, further comprising:
a refrigerant injection pipe through which the refrigerant is injected in a refrigerant circuit that is defined by the first heat exchanger and the second heat exchanger, wherein
the refrigerant injection pipe has a sealing portion sealed with a brazing material at an end.

25. The cooling device according to claim 1, wherein the first heat exchanger has first tubes each defining at least one passage,
the second heat exchanger has second tubes each defining at least one passage, and
the first tubes and the second tubes, extend in the up/down direction.

26. The cooling device according to claim 1, wherein the partition wall is parallel to the first direction.

* * * * *